(12) United States Patent
Tiwari et al.

(10) Patent No.: US 9,691,049 B2
(45) Date of Patent: Jun. 27, 2017

(54) MASTER BILL OF MATERIALS CREATION

(71) Applicant: Accenture Global Services Limited, Dublin (IE)

(72) Inventors: Manoj Tiwari, Andhra Pradesh (IN); Santiprasad Chakrabarti, Kolkata (IN); Dharmendra Singh Yadav, Hyderabad (IN); Swarnalatha Krishnamurthi, Madurai (IN)

(73) Assignee: ACCENTURE GLOBAL SERVICES LIMITED, Dublin (IE)

( * ) Notice: Subject to any disclaimer, the term of this patent is extended or adjusted under 35 U.S.C. 154(b) by 0 days.

(21) Appl. No.: 15/276,033

(22) Filed: Sep. 26, 2016

(65) Prior Publication Data

US 2017/0011342 A1    Jan. 12, 2017

Related U.S. Application Data

(63) Continuation of application No. 14/143,222, filed on Dec. 30, 2013, now Pat. No. 9,483,587.

(30) Foreign Application Priority Data

Jun. 5, 2013  (IN) ............................ 2452/CHE/2013
Aug. 27, 2013 (IN) ............................ 2452/CHE/2013

(51) Int. Cl.
*G06Q 10/08* (2012.01)
*G06F 17/50* (2006.01)

(52) U.S. Cl.
CPC ......... *G06Q 10/0875* (2013.01); *G06F 17/50* (2013.01)

(58) Field of Classification Search
CPC ............................ G06Q 10/0875; G06F 17/50
See application file for complete search history.

(56) References Cited

U.S. PATENT DOCUMENTS

| | | | | |
|---|---|---|---|---|
| 4,870,591 A * | 9/1989 | Cicciarelli | ........ | G06F 17/30994 700/107 |
| 7,610,286 B1 * | 10/2009 | Yu | .......... | G06F 21/606 |
| 7,747,483 B1 * | 6/2010 | Puerini | .................. | G06Q 10/04 705/29 |
| 9,483,587 B2 * | 11/2016 | Tiwari | .................... | G06F 17/50 |
| 2003/0163214 A1 * | 8/2003 | Ouchi | .............. | G05B 19/41865 700/97 |
| 2004/0073404 A1 * | 4/2004 | Brooks | ................ | G05B 19/409 702/183 |

(Continued)

OTHER PUBLICATIONS

"European Search Report" on EP Application No. 13006058.5, European Patent Office, dated Feb. 27, 2014. 7 pages.

*Primary Examiner* — Ramesh Patel
(74) *Attorney, Agent, or Firm* — Mannava & Kang, P.C.

(57) ABSTRACT

Master BOM creation may include extracting BOM data from first and second BOMs, and determining which BOM extracted data is greater. If the first or second BOM is a CAD BOM and the other BOM is a non-CAD BOM, the CAD BOM and non-CAD BOMs may be respectively used as a first and a second source BOM data for a master BOM table. If the first and second BOMs are non-CAD BOMs, or both of the first and second BOMs are CAD BOMs, the greater and lesser of the first and second BOM extracted data may be respectively used as the first and as the second source BOM data. A master BOM may be created based on mapping of the master BOM table to the second source BOM data.

20 Claims, 16 Drawing Sheets

(56) References Cited

U.S. PATENT DOCUMENTS

| | | | |
|---|---|---|---|
| 2005/0080502 A1* | 4/2005 | Chernyak | G06F 17/50 700/97 |
| 2006/0058993 A1* | 3/2006 | Ulreich | G06F 17/50 703/22 |
| 2007/0061154 A1* | 3/2007 | Markvoort | G06F 17/50 705/51 |
| 2011/0307100 A1* | 12/2011 | Schmidtke | G05B 19/4093 700/276 |

* cited by examiner

MASTER BILL OF MATERIALS CREATION

CROSS-REFERENCE TO RELATED APPLICATION(S)

This application is a Continuation of commonly assigned and co-pending U.S. patent application Ser. No. 14/143,222, filed Dec. 30, 2013, which claims the benefit of Provisional Patent Application Serial Number 2452/CHE/2013, filed Jun. 5, 2013, and Patent Application Serial Number 2452/CHE/2013, filed Aug. 27, 2013, the disclosures of which are hereby incorporated by reference in their entireties.

BACKGROUND

Development of a product may include management of a bill of materials (BOM). A BOM may represent various phases of product development and product configuration changes at various stages of product development. For example, a BOM may include a list of the raw materials, sub-assemblies, intermediate assemblies, sub-components, and parts, and the quantities of each needed to manufacture an end product. Examples of BOMs may include design BOMs used for a design phase of a product, manufacturing BOMs used for a manufacturing phase of a product, etc. Management of different types of BOMs can be challenging.

BRIEF DESCRIPTION OF DRAWINGS

Features of the present disclosure are illustrated by way of examples shown in the following figures. In the following figures, like numerals indicate like elements, in which.

DETAILED DESCRIPTION

Figure 1:
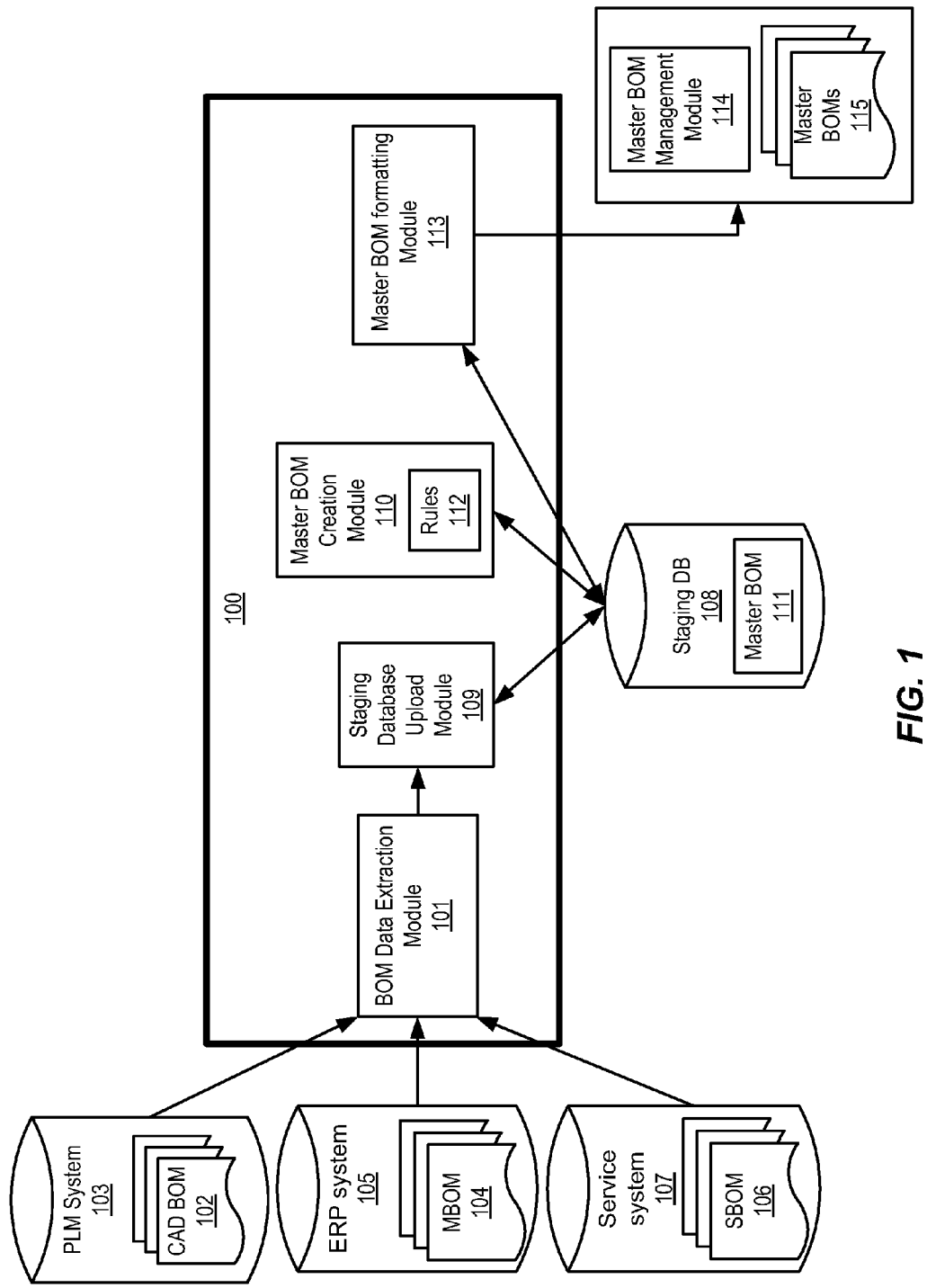
FIG. 1 illustrates an architecture of a master bill of materials (BOM) creation system, according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

BOMs used for development of a product may include various types of BOMs, such as, for example, design BOMs, manufacturing BOMs, etc., that may be implemented and managed using different sources. Due to the diverse content of such BOMs, the BOMs can be challenging to manage and synchronize. For example, BOMs may include geometric computer aided design (CAD) details (e.g., details related to two-dimensional (2D) models, three-dimensional (3D) models, etc.) that may be managed as a part of a design BOM or separately. Further, BOMs may be subject to changes throughout the product design and manufacturing phases. These and other factors may create complexities in BOM management.

According to an example, a master BOM creation system and a method for master BOM creation are provided for the management of different BOM configurations by creation of a master BOM. Any changes to the different BOM configurations may be directly made to the master BOM. The master BOM creation system and the method for master BOM creation may also provide for consolidation of different BOMs from different sources to a single master BOM including all valid configuration information from the different BOMs, including BOMs with geometric CAD details. The valid configuration information from the different BOMs may be preserved based, for example, on the sequence of BOM merging and/or the differentiation between merging of BOMs with geometric CAD details and BOMs without geometric CAD details, as disclosed herein. Further, the valid configuration information from the different BOMs may be preserved by accounting for different alternate values, for example, from a material BOM (MBOM), and creating various entries in the master BOM based on the different alternate values related to the entries.

For the master BOM creation system and the method for master BOM creation disclosed herein, generally, BOM data may be extracted from different sources, such as, for example, CAD BOM data from product lifecycle management (PLM) systems, MBOM data from enterprise resource planning (ERP) systems, service BOM (SBOM) data from service systems, etc. The service systems may include, for example, maintenance systems for products that have been developed. The PLM systems may include, for example, product design and manufacturing systems. The ERP systems may include, for example, systems related to inventory management. The extracted BOM data may be merged in a staging database (DB) for creation of a master BOM. The system and method disclosed herein generally provide for merging of BOMs from different sources based on different characteristics, such as, for example, parent ID, child ID (or child component ID), quantity, find number, etc., associated with BOMs. The system and method disclosed herein also provide for the formatting of the master BOM based, for example, on one or more of the source BOM configurations. For example, a master BOM including geometric CAD details may be formatted so as to avoid any impact on original CAD BOM data related to CAD geometry and assembly. A master BOM including geometric CAD details may be distinguished in the master BOM creation system by loading the geometric CAD details in a specific sequence and with different configurations in the master BOM creation system, so as to avoid any impact on original CAD BOM data related to CAD geometry and assembly. The system and method disclosed herein also provide for management of the master BOM.

The system and method disclosed herein provide for data security enhancement, for example, by using PLM security features. For example, different systems, such as PLM systems, ERP systems, service systems, etc., may include different levels of security. According to an example, the system and method disclosed herein may provide for data security enhancement by using the security features of PLM systems for the master BOM. Further, instead of managing multiple BOMs, the system and method disclosed herein provide for data security enhancement based on the management of a single master BOM that accounts for the features of multiple BOMs from different systems, such as PLM systems, ERP systems, service systems, etc. The system and method disclosed herein provide for efficient usage of data for manufacturing operations by linking a bill of process (BOP) and a mechanical computer aided design (MCAD) assembly. The system and method disclosed herein provide for migration of MBOM data from SAP (i.e., an ERP system) and merging with a manufacturing CAD BOM to create a master BOM. The system and method disclosed herein also provide for migration of router data from SAP, creation of a product link between a master BOM and BOP, and migration of component allocation information from SAP (link between MBOM resource and router operation).

According to an example, the master BOM creation system may include a memory storing machine readable instructions to extract BOM data from a first BOM (e.g., a first BOM system), and extract BOM data from a second BOM (e.g., a second BOM system). The machine readable instructions may determine if the first BOM extracted data is greater than the second BOM extracted data. If one of the first and second BOMs is a CAD BOM and the other one of the first and second BOMs is a non-CAD BOM, the machine readable instructions may use the CAD BOM as a first source BOM data for a master BOM table and the non-CAD BOM as a second source BOM data for the master BOM table. If the first and second BOMs are non-CAD BOMs, or both of the first and second BOMs are CAD BOMs, the machine readable instructions may use the greater of the first BOM extracted data and the second BOM extracted data as the first source BOM data for the master BOM table, and the lesser of the first BOM extracted data and the second BOM extracted data may be designated as the second source BOM data. The machine readable instructions may further determine a list of parent identifications (IDs) from the master BOM table, for each parent ID of the list of parent IDs, obtain a corresponding part number or material number from the second source BOM data, for example, based on mapping defined for BOM sources, and create a master BOM based on mapping of the master BOM table to the second source BOM data. The master BOM creation system may include a processor to implement the machine readable instructions.

According to an example, the method for master BOM creation may include extracting BOM data from a first BOM (e.g., a first BOM system), and extracting BOM data from a second BOM (e.g., a second BOM system). The method may further include determining if the first BOM extracted data is greater than the second BOM extracted data. If one of the first and second BOMs is a CAD BOM and the other one of the first and second BOMs is a non-CAD BOM, the method may include using the CAD BOM as a first source BOM data for a master BOM table and the non-CAD BOM as a second source BOM data for the master BOM table. If the first and second BOMs are non-CAD BOMs, or both of the first and second BOMs are CAD BOMs, the method may include using the greater of the first BOM extracted data and the second BOM extracted data as the first source BOM data for the master BOM table, and the lesser of the first BOM extracted data and the second BOM extracted data may be designated as the second source BOM data. The method may include determining a list of parent IDs from the master BOM table, for each parent ID of the list of parent IDs, obtaining a corresponding part number or material number from the second source BOM data, and creating a master BOM based on mapping of the master BOM table to the second source BOM data.

The master BOM creation system and the method for master BOM creation disclosed herein provide a technical solution to the technical problem of BOM creation and management. For example, BOMs used for development of a product may include various types of BOMs, such as, for example, design BOMs, manufacturing BOMs, etc., that may be implemented and managed using different sources. Due to the diverse content of such BOMs, the BOMs can be challenging to manage and synchronize. Moreover, manual creation and management of such diverse BOMs is not a viable solution given the heterogeneity and complexities associated with BOMs. The system and method disclosed herein provide the technical solution of creating a master BOM by extracting BOM data from a first BOM, extracting BOM data from a second BOM, and determining if the first BOM extracted data is greater than the second BOM extracted data. For example, a first application (e.g. ERP, PLM or service application) may store a first BOM in a first format, a second application (e.g. ERP, PLM or service application) may store a second BOM in a second format, where the second format differs from the first format. If one of the first and second BOMs is a CAD BOM and the other one of the first and second BOMs is a non-CAD BOM, the system and method disclosed herein include using the CAD BOM as a first source BOM data for a master BOM table and the non-CAD BOM as a second source BOM data for the master BOM table, and if the first and second BOMs are non-CAD BOMs, or both of the first and second BOMs are CAD BOMs, using the greater of the first BOM extracted data and the second BOM extracted data as the first source BOM data for the master BOM table, and the lesser of the first BOM extracted data and the second BOM extracted data is designated as the second source BOM data. The system and method disclosed herein further include determining a list of parent IDs from the master BOM table, for each parent ID of the list of parent IDs, obtaining a corresponding part number or material number from the second source BOM data, and creating a master BOM based on mapping of the master BOM table to the second source BOM data. The mapping may be based on rules to overwrite properties between the master BOM table and the second source BOM data, and for defining alternatives. Further, a master BOM including geometric CAD details may be distinguished in the master BOM creation system for loading the geometric CAD details in a specific sequence and with different configurations in the master BOM creation system, so as to avoid any impact on original CAD BOM data related to CAD geometry and assembly. For example, geometric CAD details may be preserved in the master BOM such that any original CAD BOM data related to CAD geometry and assembly is not impacted or otherwise altered. For example, the geometric CAD details may be loaded in a master BOM table for creation of the master BOM, and the BOM lines of the master BOM table including the geometric CAD details may be used to determine whether a new BOM line is created or whether an existing BOM line from the master BOM table is used to merge with BOM lines of other BOMs to generate the master BOM. The determination to create a new BOM line or to use an existing BOM line may be based, for example, on a quantity value associated with the BOM lines that are being compared. Moreover, any transformations and other properties associated with the CAD geometry and assembly may be preserved in the master BOM. The master BOM may provide for reduced BOM management cycle time based on use of the single master BOM that is derived from multiple BOMs. The master BOM may provide for increased efficiency and improved control of manufacturing processes by linking the single master BOM to the BOP. Further, the master BOM may provide for improved impact analysis on change management of BOMs due to visualization of changes on the single master BOM.

FIG. 1 illustrates an architecture of a master BOM creation system 100, according to an example of the present disclosure. The master BOM creation system 100 may generally include a BOM data extraction module 101 to extract BOM data from different sources, such as, for example, CAD BOM data 102 (also referred to herein as CAD BOM 102) from a PLM system 103, MBOM data 104 (also referred to herein as MBOM 104) from an ERP system 105, SBOM data 106 (also referred to herein as SBOM 106) from a service system 107, etc. The CAD BOM data 102 from the PLM system 103 may include geometric and assembly information related to a product. The MBOM data 104 from the ERP system 105 may include material alternatives (e.g., alternative components for a MBOM). The extracted BOM data may be uploaded to a staging DB 108 by a staging DB upload module 109. According to an example, the extracted BOM data may be uploaded to the staging DB 108 to populate tables corresponding to each BOM source (e.g., PLM system 103, ERP system 105, service system 107, etc.) and/or each BOM (e.g., CAD BOM 102, MBOM 104, SBOM 106, etc.). A master BOM creation module 110 may use the uploaded BOM data to create a master BOM 111. Alternatively, the master BOM creation module 110 may use the uploaded BOM data to create a plurality of master BOMs. For example, the master BOM creation module 110 may merge BOMs from different sources based on different characteristics and mappings, such as, for example, parent ID (or parent component ID), child ID (or child component ID), quantity, find number, etc., associated with BOMs. The master BOM 111 may include variants (e.g., variant 1, variant 2, etc.) that may correspond to different alternatives for MBOM data 104 from the ERP system 105. The master BOM creation module 110 may use rules 112, for example, to overwrite any properties between two BOMs, mapping, and for defining alternatives as described below. According to an example, the master BOM creation module 110 may use the data uploaded to the staging DB 108 to populate a master BOM table that defines the master BOM 111. A master BOM formatting module 113 may format the master BOM 111 based, for example, on one or more of the source BOM configurations. A master BOM including geometric CAD details may be distinguished in the master BOM creation system 100 by loading the geometric CAD details in a specific sequence and with different configurations in the master BOM creation system 100, so as to avoid any impact on original CAD BOM data related to CAD geometry and assembly. The formatted master BOM 111 may be uploaded to a master BOM management module 114 which may provide for management of one or more master BOMs 115 including the master BOM 111.

As described herein, the modules and other components of the system 100 may comprise machine readable instructions stored on a non-transitory computer readable medium. In addition, or alternatively, the modules and other components of the system 100 may comprise hardware or a combination of machine readable instructions and hardware.

Figure 2:
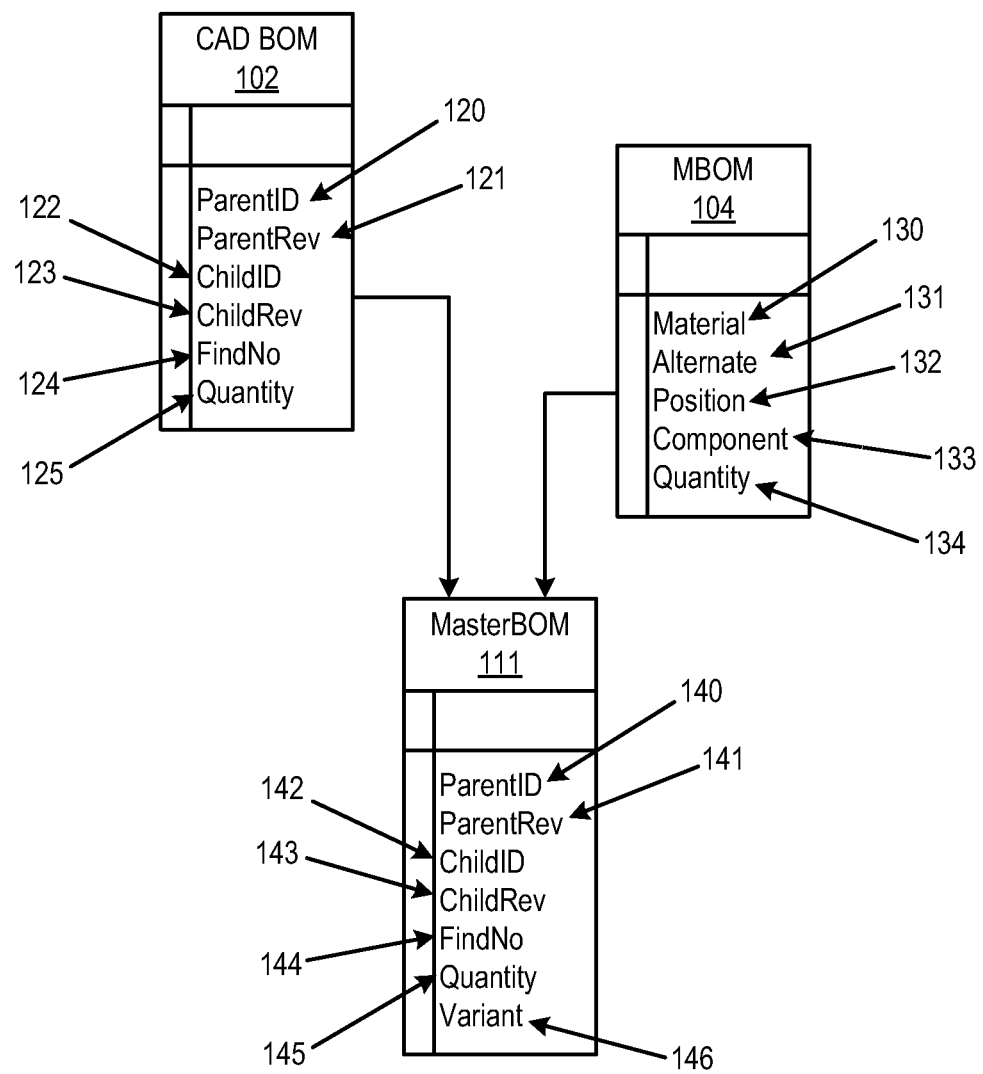
FIG. 2 illustrates an example of merging two BOMs, according to an example of the present disclosure.

Referring to FIGS. 1 and 2, the CAD BOM data 102, the MBOM data 104, and the SBOM data 106 may generally include common characteristics or attributes such as, for example, a parent ID (or parent component ID) and child ID (or child component ID) that generally represent a part number or a material number from a respective source (e.g., PLM system 103, ERP system 105, service system 107, etc.). The mapping of attributes from different BOM sources may define the merging logic of BOMs. For example, referring to FIG. 2, the mapping of parent ID at 120 from the CAD BOM data 102 to material number (e.g., material specification at 130) from the MBOM data 104 may define merging based on comparing parent ID to material number. The CAD BOM data 102, the MBOM data 104, and the SBOM data 106 may further include a quantity and sequence or find number. The CAD BOM data 102, the MBOM data 104, and the SBOM data 106 may be defined to include a hierarchy of levels. Each level of a BOM may be independent of a parent BOM (i.e., a parent BOM level), and characteristics of a child BOM (i.e., a child BOM level) may remain independent of all parent BOMs where the child BOM is used. For example, referring to FIG. 2, the CAD BOM data 102 from the PLM system 103 may generally include characteristics such as parent ID at 120, parent revision number (i.e., rev) at 121, child ID at 122, child revision number at 123, find number or information at 124, and quantity at 125. Additionally, the MBOM data 104 from the ERP system 105 may generally include characteristics such as material specification at 130, material alternate at 131, position at 132, component specification at 133, and quantity at 134. The master BOM 111 may include characteristics determined from the CAD BOM data 102 and the MBOM data 104 such as parent ID at 140, parent revision number at 141, child ID at 142, child revision number at 143, find number or information at 144, quantity at 145, and variant option at 146. The SBOM data 106 may include characteristics similar to the MBOM data 104. The parent ID and child ID form the CAD BOM data 102 may map to material and component attributes of the MBOM data 104.

Referring to FIG. 2, the variant option at 146 may be populated for a merged BOM line as follows. The variant option may be defined based on the alternate value in the MBOM data 104. The source BOM from which the variant option may be taken may be defined in the rules 112. The variant option at 146 may be populated if the BOM alternate is specified in a source BOM (i.e., MBOM in this case). The variant option at 146 in the master BOM 111 may be updated with a new variant option (i.e., new entry) if the variant option at 146 is already populated with the given option (e.g., alternate from MBOM). The variant option at 146 may be populated for creation of the master BOM 111 by filtering (i.e., removal) of a BOM line including all alternates where no variant should be created, and other BOM lines where variants are present in the staging DB 108 and required to be populated as a variant option in the master BOM 111. The filtering may be performed in the master BOM formatting module 113 while loading the master BOM 115 in the master BOM management module 114.

Figure 5:
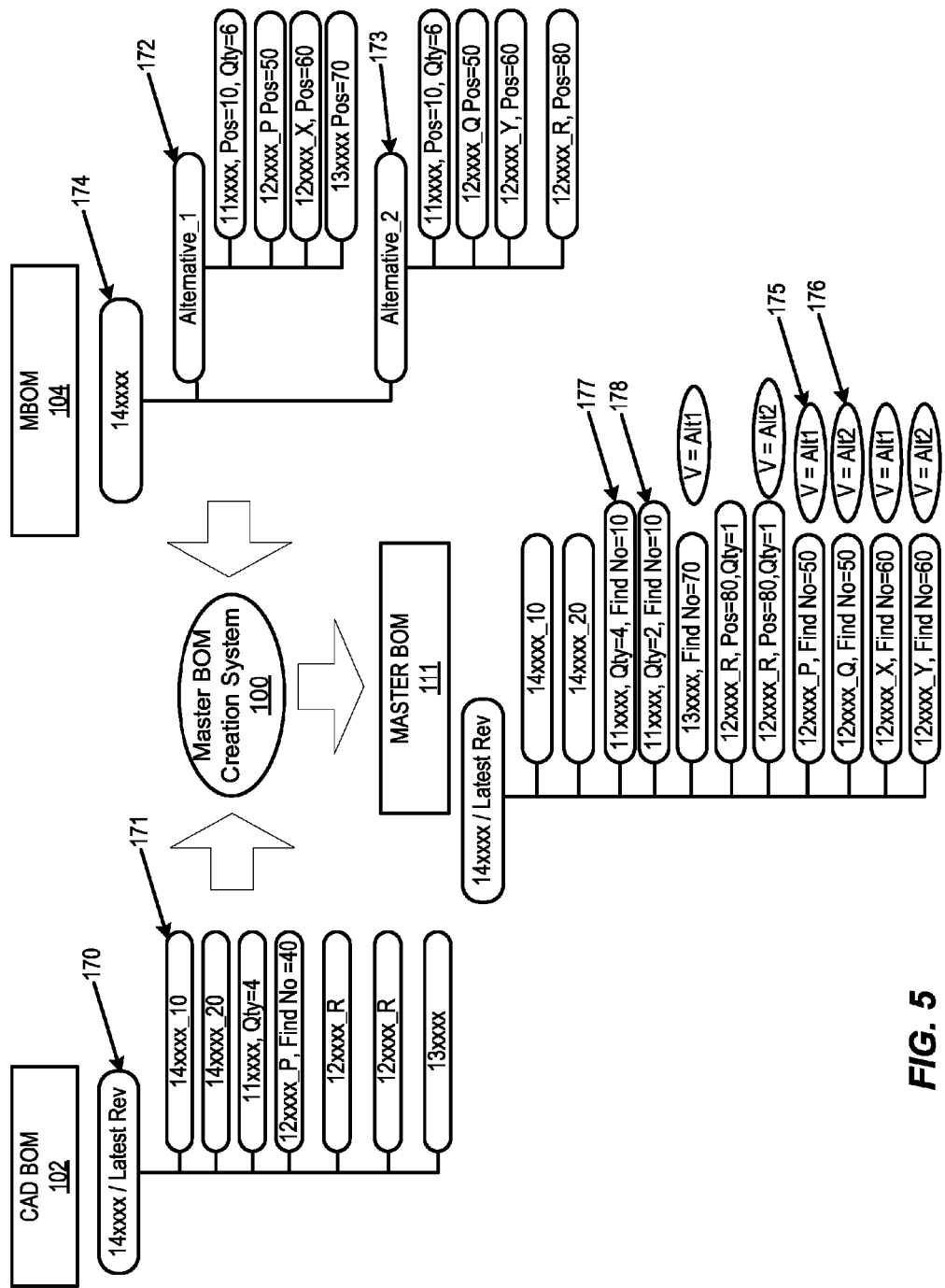
FIG. 5 illustrates an example of BOM merge use cases, according to an example of the present disclosure.

In order to create the master BOM 111, generally, the master BOM creation module 110 may create the master BOM 111 on the basis that BOMs from different sources include the same parent and child IDs (i.e., the ID or part number for parent and child for different BOM sources will remain the same based on mapping information). If different sources include the same parent and child IDs, the master BOM creation module 110 may map parent and child IDs for different sources for creation of the master BOM 111. The master BOM creation module 110 may merge BOMs from different sources by comparing BOM line characteristic such as quantity and find number. The master BOM creation module 110 may use the rules 112 to overwrite any properties between two BOMs. For example, the rules 112 may be used to overwrite a find number for a CAD BOM by a find number from a MBOM from an ERP system. The rules 112 may be further used to determine if a master BOM 111 includes alternatives (e.g., related to a MBOM). If a master BOM 111 is determined to include alternatives, the master BOM 111 may further include a variant that corresponds to an alternative value in a source BOM. BOMs used by the master BOM creation module 110 may also include quantities defined in whole numbers. Further, for any BOMs merged to create the master BOM 111, merging may be performed at a single level such that any next level merging may be performed independently at a next level. Each level of BOM hierarchy may be treated independently as a new BOM merge scenario. For example, FIG. 5 illustrates an example of merging of a single level BOM.

The master BOM creation module 110 may create the master BOM 111 from BOMs from different sources, with each BOM used by the master BOM creation module 110 including same child IDs (e.g., child component IDs based on mapping) with a same or different associated quantities. Each BOM used by the master BOM creation module 110 may also include different child IDs with same or different associated quantities. The master BOM creation module 110 may also create the master BOM 111 from BOMs from different sources, with each BOM used by the master BOM creation module 110 including same child IDs, same or different associated quantities, and same or different find numbers. Each BOM used by the master BOM creation module 110 may also include different child IDs with same or different associated quantities, and same or different find numbers. Further, for CAD and non-CAD BOMs (e.g., MBOM 104, SBOM 106, etc.), the master BOM creation module 110 may create the master BOM 111 by merging CAD and non-CAD BOMs.

Figure 3:
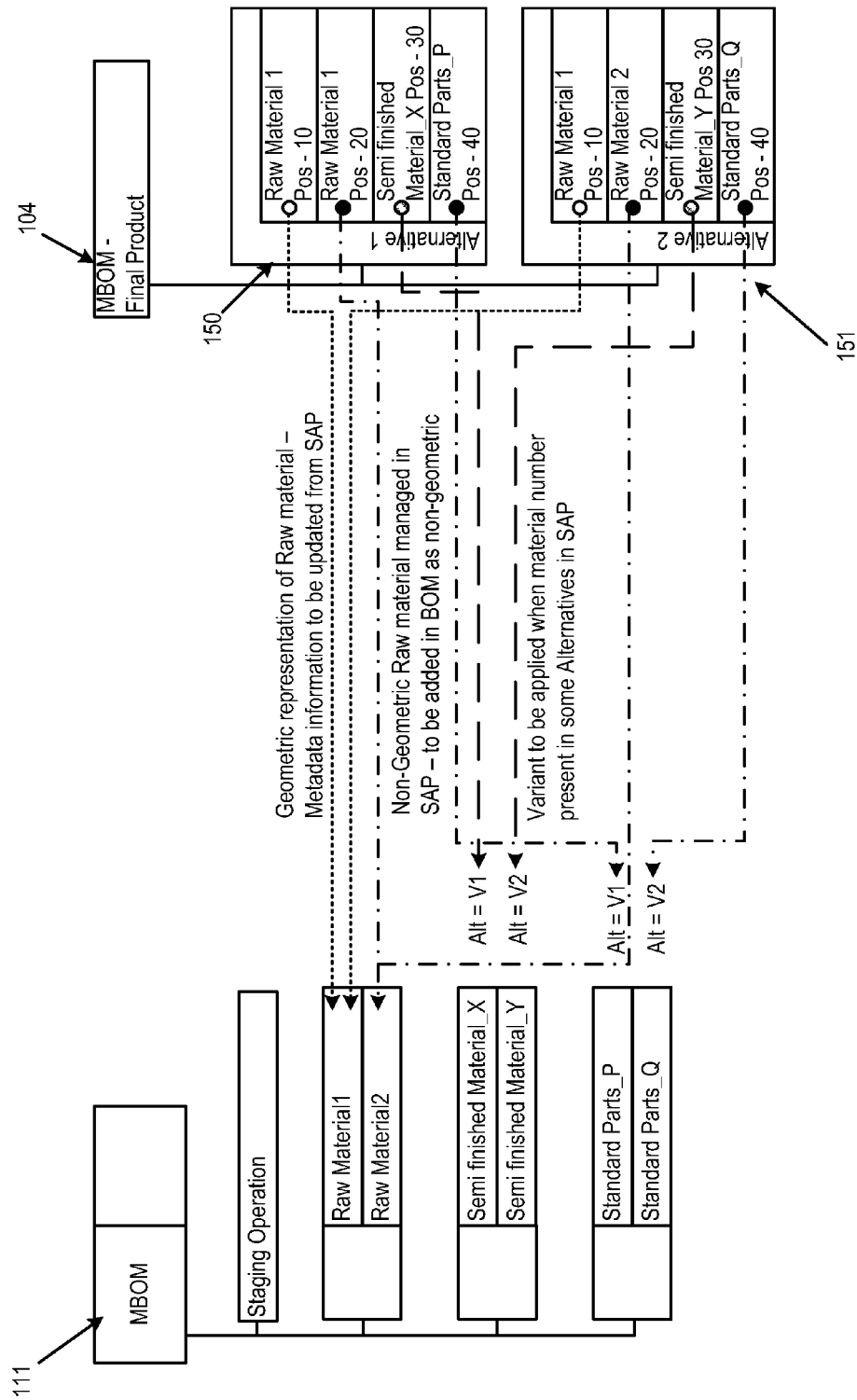
FIG. 3 illustrates an example of a part data model, according to an example of the present disclosure.

Referring to FIGS. 1-3, FIG. 3 illustrates an example of a part data model, according to an example of the present disclosure. For example, FIG. 3 illustrates a master BOM 111 in the staging DB 108 and a MBOM 104. The MBOM 104 may include an alternative-1 at 150 and an alternative-2 at 151. The various components of the alternative-1 at 150 and the alternative-2 at 151 may be mapped to a master BOM table (as discussed in further detail herein) in the staging DB 108. For example, raw material1 pos-10 of the alternative-1 at 150 and raw material1 pos-10 of the alternative-2 at 151 may be mapped to raw material 1 in the master BOM table. Similarly, raw material2 pos-10 of the alternative-1 at 150 and raw material2 pos-20 of the alternative-2 at 151 may be mapped to raw material 2 in the master BOM table. Semi-finished material_x pos-30 of the alternative-1 at 150 and semi-finished material_y pos-30 of the alternative-2 at 151 may be respectively mapped to semi-finished material_x for alternative variation 1 (V1) and semi-finished material_y for alternative variation 2 (V2) in the master BOM table. Similarly, standard parts_p pos-40 of the alternative-1 at 150 and standard parts_q pos-40 of the alternative-2 at 151 may be respectively mapped to standard parts_p for alternative variation 1 (V1) and standard parts_q for alternative variation 2 (V2) in the master BOM table.

Figure 4:
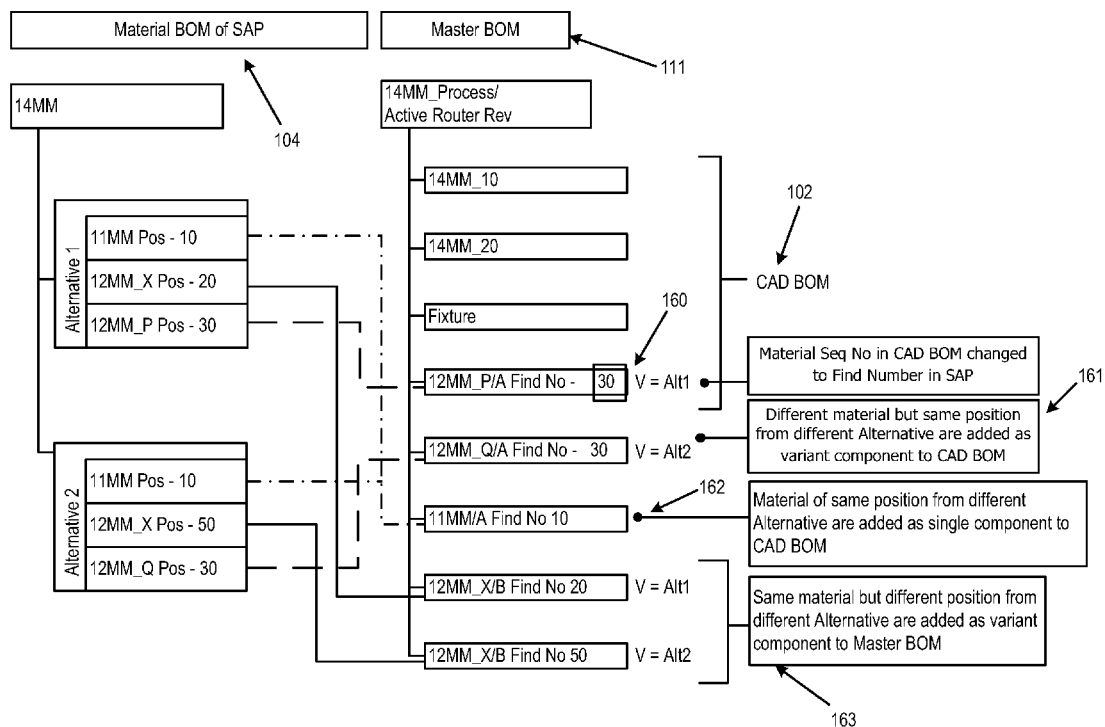
FIG. 4 illustrates an example of merging of a computer aided design (CAD) BOM and material BOM (MBOM), according to an example of the present disclosure.

Referring to FIGS. 1-4, FIG. 4 illustrates an example of merging of CAD BOM and MBOM, according to an example of the present disclosure. For example, FIG. 4 illustrates a master BOM 111 in the staging DB 108 and a MBOM 104. For the master BOM 111, for a CAD BOM 102 used as a master BOM table, as shown at 160, the master BOM creation module 110 may use rules 112 such that a material sequence number in a CAD BOM is changed to a find number in a MBOM of a SAP. As illustrated at 161, a different material with a same position from a different alternative may be added as a variant component to a CAD BOM 102 used as a master BOM table. As illustrated at 162, a material of a same position from different alternative may be added as a single component to a CAD BOM 102 used as a master BOM table. As illustrated at 163, a same material but a different position from different alternative may be added as a variant component (with variant option) to the master BOM 111.

Referring to FIGS. 1-5, FIG. 5 illustrates an example of BOM merge use cases for the CAD BOM 102 and a non-CAD BOM such as the MBOM 104, according to an example of the present disclosure. The CAD BOM 102 of FIG. 5 may include a parent ID at 170. For the parent ID at 170, the "latest rev" may reference a version of the parent ID. In child ID 14xxxx at 171, the designation "10" may represent a part number scheme for given object type for child ID 14xxxx. The MBOM 104 may include alternatives, for example, at 172, 173, for parent ID at 174. The parent ID at 174 for the MBOM 104 may map to the parent ID at 170 for the CAD BOM 102. The position (e.g., POS=10) for the MBOM may perform a similar function as the find number for the CAD BOM 102, and may be mapped to the find number for the CAD BOM 102. The master BOM creation module 110 may create the master BOM 111 by merging the CAD BOM 102 and the MBOM 104 as described in further detail herein. The master BOM 111 may be created by first matching any material numbers (e.g., parent ID at 174) from the MBOM 104 with an item ID (e.g., parent ID at 170) of the CAD BOM 102. Lines from the CAD BOM 102 that are not present in the MBOM 104 may be used in the master BOM 111 without modification. For common BOM lines, a BOM line from the CAD BOM 102 may be uploaded in the master BOM 111 with given quantity. BOM lines may be added from the MBOM 104 based on quantity calculation in the master BOM 111. For example, referring to FIG. 5, component 11xxxx from the CAD BOM 102 has a CAD BOM line with quantity of four. This BOM line will be brought as is in the master BOM 111 (e.g., see at 177). When the MBOM 104 is merged with the CAD BOM 102, the logic will check for 11xxxx to determine how many are present (e.g., sum of quantity for BOM line). In this case, the quantity value is four. In the MBOM 104, the quantity for 11xxxx BOM line is six. Hence a new BOM line will be added in the master BOM 111 for component 11xxxxx with a quantity value of two (e.g., see at 178). The quantity for the CAD BOM line will remain the same (e.g., see at 177). Further, only the find number (e.g., find number=10) will be changed to the MBOM value. Lines from the MBOM 104 that have different material ID but identical position for different alternatives may be used in the master BOM 111 as variant components (e.g., at 175, 176). Lines from the MBOM 104 that have identical material ID and identical position for all alternatives may be used in the master BOM 111 as non-variant components (e.g., at 177, 178). The CAD BOM 102 may structurally differ from non-CAD BOMs (e.g., the MBOM 104) in that the CAD BOM 102 may include files including geometric CAD details (e.g., details related to 2D models, 3D models, etc.), with such files including alignment and transformation related information for a CAD assembly. The CAD BOM 102 may further include attributes related to a CAD assembly corresponding to the particular CAD BOM 102, with the attributes including, for example, information related to transformation of sub-assemblies from a local coordinate system to a global coordinate system.

Referring to FIGS. 1-6, FIG. 6 illustrates a master BOM creation process 200, according to an example of the present disclosure. Generally, the master BOM creation process 200 may begin by extraction of BOM data from different sources, such as, for example, CAD BOM data 102 from the PLM system 103, MBOM data 104 from the ERP system 105, SBOM data 106 from the service system 107, etc. The BOM data extraction module 101 may extract BOM data based on data formats specific to the different sources (e.g., PLM system 103, ERP system 105, service system 107, etc.). The BOM data may be included in delimited flat files that include BOM line data. The extracted BOM data may be uploaded to the staging DB 108 by the staging DB upload module 109. For example, the master BOM table may be created by loading delimited BOM source data (e.g., a first source BOM data) into a database table for the staging DB 108. For example, the staging DB upload module 109 may receive an American standard code for information interchange (ASCII) file as an input from the BOM data extraction module 101, and upload the BOM data to the staging DB 108 using a .net based entity model framework. The master BOM creation module 110 may use the uploaded BOM data to create the master BOM 111. For example, the master BOM creation may be performed by using a series of SQL procedures that run in sequence for creating the master BOM 111. The master BOM formatting module 113 may format the master BOM 111 based, for example, on one or more of the source BOM configurations, and upload the formatted master BOM 111 to the master BOM management module 114. The source BOM configurations may be determined from the delimited flat files that include BOM line data. Alternatively, the master BOM formatting module 113 may format the master BOM 111 based on a format requested by the master BOM management module 114.

Referring to FIGS. 1-6, for the master BOM creation process 200, at block 201, the master BOM creation module 110 may load BOM data from a table corresponding to a first source (i.e., including first BOM data) to the master BOM table. The master BOM table may include a column that defines whether the BOM data source is a CAD or a non-CAD data source. For a CAD BOM and a non-CAD BOM, the first BOM data may be determined from the CAD BOM. For non-CAD BOMs, the first BOM data may be determined as the BOM having greater data (i.e., more data lines). The master BOM creation module 110 may load information such as, for example, parent component ID, child component ID, quantity, find number, variant information, etc., to a master BOM table in the staging DB 108. For example, referring to FIG. 5, the master BOM creation module 110 may load BOM data from the CAD BOM 102 as the first BOM data.

At block 202, the master BOM creation module 110 may determine a list of parent IDs from the master BOM table. For example, referring to FIG. 5, the master BOM creation module 110 may determine a list of parent IDs including the parent ID 14xxxx at 174 from the master BOM table.

At block 203, for each parent ID in the master BOM table, at block 204, the master BOM creation module 110 may obtain corresponding part number or material number information from a second source (i.e., including second BOM data). For example, referring to FIG. 5, for each parent ID including the parent ID 14xxxx at 174 in the master BOM table that uses the MBOM 104, at block 204, the master BOM creation module 110 may obtain corresponding part number or material number information from the CAD BOM 102. The evaluation at block 203 may be performed by obtaining parent IDs from a first source and obtaining corresponding BOM lines from a second source.

At block 205, the master BOM creation module 110 may further obtain all rows from the second source BOM table (i.e., from the second BOM data) where parent ID is equal to material number (or part number). For example, referring to FIG. 5, the master BOM creation module 110 may further obtain all rows from the second source BOM table (i.e., from the MBOM 104) where parent ID is equal to material number (or part number). For example, referring to FIG. 5, for the MBOM 104, all BOM lines for both alternative_1 at 172 and alternative_2 at 173 of parent ID 14xxxx at 174 may be loaded for processing.

At block 206, for each row (i.e., each BOM line) from the second source, at block 207, the master BOM creation module 110 may determine if for a child ID a find number exists in the master BOM table from a CAD BOM line with no update from a MBOM. Thus, for each BOM line from the second source, the master BOM creation module 110 may check the child component is present in master BOM table with no update of BOM line from the second source (i.e., there is a value in the variant column).

At block 208, if the determination at block 207 is yes, the master BOM creation module 110 may update the find number of the appropriate master BOM table line with the second source BOM. Thus, the master BOM creation module 110 may update the BOM line with find number from the second source.

At block 209, if the determination at block 207 is no, the master BOM creation module 110 may determine if a child component ID and associated find number are present in the master BOM table. Thus, with reference to blocks 206-209, the comparison with respect to find numbers is only performed if the find numbers are already modified for a MBOM for other alternatives. If the BOM line is originating from a CAD BOM, then the comparison is from a component ID and the find number changes to that alternative. For example, referring to FIG. 5, for component 11xxxx from the CAD BOM 102, the comparison will only be with respect to a component of the child ID. With respect to alternative_2, the comparison will be for both component and child ID. The logic to determine any modification is obtained from the alternative value which is populated in the variant column in the master BOM 111. According to another example, referring to FIG. 5, with respect to component 13xxxx from the CAD BOM 102, for alternative_1, the same BOM line will be used with a change in the find number to alternative_1 find number=70. If the child component ID is present in the master BOM table, at block 209, the master BOM creation module 110 may further verify if an associated find number is the same as or different than the master BOM table. For example, referring to FIG. 5, for the example of the 11xxxx component of the CAD BOM 102 and the MBOM 104, when the 11xxxx component comes from MBOM alternative_2, the master BOM creation module 110 may check if the find number is the same or not.

At block 210, if the find number determined at block 209 is the same find number compared to the master BOM table, the master BOM creation module 110 may check the associated quantity value in the master BOM table by summing all given components in the master BOM table having the same find number and component ID. For example, referring to FIG. 5, the processing at block 210 is illustrated for the 11xxxx component after alternative_1 is created (e.g., the CAD BOM 102 with quantity four plus newly created BOM line with quantity two). When the 11xxxx component comes for alternative_2, all BOM lines with the given find number 10 are summed.

At block 211, if the master BOM table quantity value determined at block 210 is the same as the quantity in the BOM line from the second source (i.e., master BOM table quantity=BOM quantity for second source), at block 212, the associated BOM alternate value may be added in the variant column of the master BOM table for all matching BOM lines in the master BOM table. Further, at block 213, the associated BOM line for the second source may be marked as processed. For example, referring to FIG. 5, the processing at blocks 211-213 is illustrated for the 11xxxx component after alternative_1 is created (e.g., CAD BOM 102 with quantity four plus newly created BOM line with quantity two).

Figure 6:
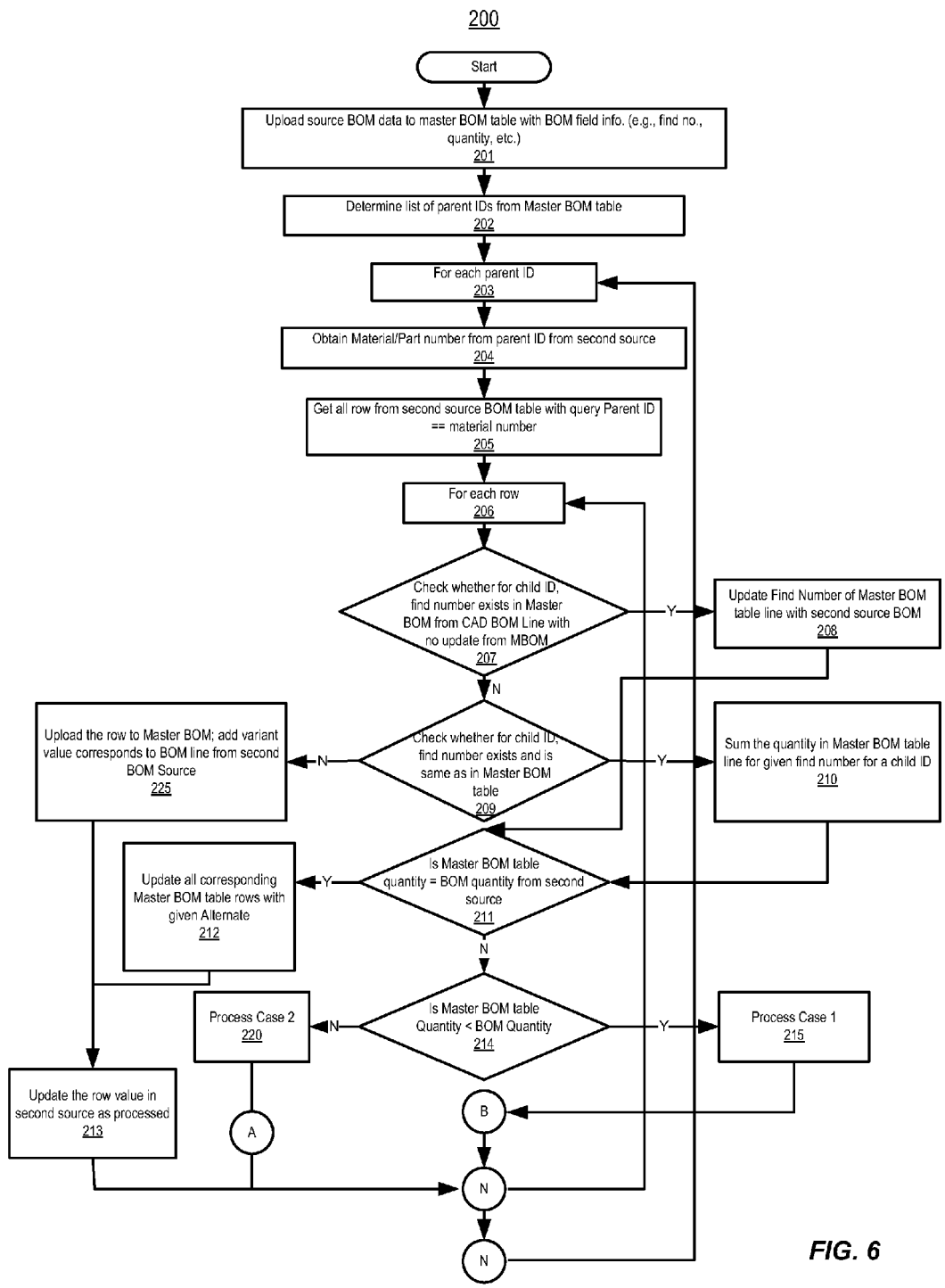
FIG. 6 illustrates a master BOM creation process, according to an example of the present disclosure.
Figures 7A, 7B:
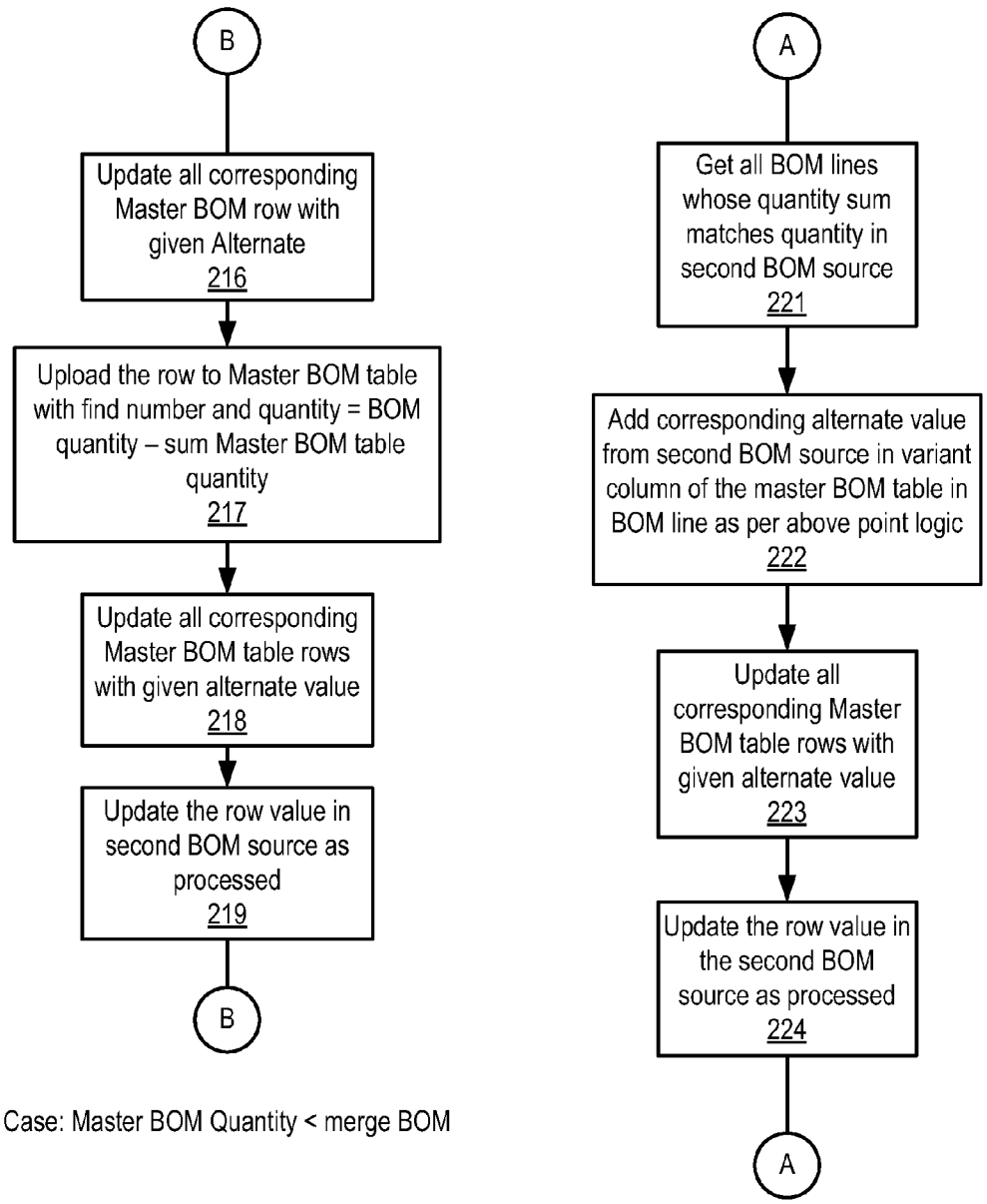
FIGS. 7A and 7B illustrate use cases for the master BOM creation process of FIG. 6, according to an example of the present disclosure.

At block 214, if the master BOM table quantity value determined at block 210 is different than the quantity in the BOM line from the second source, and if the master BOM table quantity is less than the quantity in the BOM line from the second source, the master BOM creation module 110 may process case 1 at block 215. For example, referring to FIG. 5, the processing at blocks 214 and 215 is illustrated for the 11xxxx component where when the MBOM 104 alternative_1 11xxxx component is compared with the corresponding master BOM 11xxxx component, the quantity from the master BOM 111 is less (e.g., 4<6). Referring to FIGS. 6 and 7A, case 1 may be designated as process "B" shown in FIG. 7A.

Referring to FIG. 7A, at block 216, the master BOM creation module 110 may update all corresponding master BOM table rows with given alternate value (i.e., corresponding alternate value) from the second BOM source.

At block 217, the master BOM creation module 110 may add the BOM line data in the master BOM table with a find number the same as from the BOM line in the second source and quantity equal to the difference between the quantity value in the second source BOM and the master BOM table (i.e., upload the row to the master BOM table with the find number and quantity=BOM quantity in the second source−sum of master BOM table quantity).

At block 218, the master BOM creation module 110 may add the corresponding alternate value from the second BOM source in the variant column in the master BOM table in the added BOM line data as well as in the BOM line where the find number matches a given BOM line (i.e., update all corresponding master BOM table rows with given alternate value).

At block 219, the master BOM creation module 110 may mark the row value in the second BOM source as processed for the given BOM line (i.e., update the row value in the second BOM source as processed). For example, referring to FIG. 5, the processing at block 219 is illustrated for the 11xxxx component where the BOM line will be updated for quantity of four and a new BOM line will be created in the master BOM 111 for the 11xxxx component with quantity of two.

Referring to FIGS. 6 and 7B, at block 214, if the master BOM table quantity is greater than the quantity in the BOM line from the second source, the master BOM creation module 110 may process case 2 at block 220. For example, referring to FIG. 5, the processing at block 220 is illustrated for the 12xxx_R component where the 12xxx_R component has two BOM lines in the CAD BOM 102, and the 12xxx_R component has only one BOM line with quantity in MBOM alternative_2. In this case, the master BOM quantity>MBOM quantity. Therefore, only one of the BOM lines will be updated with alternative_2 (i.e., Alt2) value. The find number of all BOM lines for 12xxx_R may be updated as per the rule of using the find number from the MBOM 104. Referring to FIGS. 6 and 7B, case 2 may be designated a process "A" shown in FIG. 7B.

Referring to FIG. 7B, at block 221, the master BOM creation module 110 may obtain all BOM lines whose quantity sum matches the quantity in the second BOM source.

At block 222, the master BOM creation module 110 may add the corresponding alternate value from the second BOM source in the variant column of the master BOM table in the BOM line (i.e., add corresponding alternate value from second BOM source in variant column of the master BOM table in BOM line as per above point logic).

At block 223, the master BOM creation module 110 may add corresponding alternate value from the second BOM source in the variant column in all corresponding rows of the master BOM table (i.e., update all corresponding master BOM table rows with given alternate value).

At block 224, the master BOM creation module 110 may mark the row value in the second BOM source as processed for the given BOM line (i.e., update the row value in the second BOM source as processed). For example, referring to FIG. 5, the processing at block 224 is illustrated for the 12xxx_R component where the 12xxx_R component has two BOM lines in the CAD BOM 102, and the 12xxx_R component has only one BOM line with quantity in the MBOM alternative_2. In this case, the master BOM quantity >MBOM quantity. Therefore, only one of the BOM lines will be updated with alternative_2 (i.e., Alt2) value. The find number of all BOM lines for 12xxx_R may be updated as per the rule of using the find number from the MBOM 104.

Referring to FIG. 6, at block 225, if the find number determined at block 209 is different compared to the master BOM table, the master BOM creation module 110 may add BOM line data in the master BOM table with the find number and quantity same as from the BOM line in the second BOM source (i.e., upload the row to the master BOM table). Further, at block 225, the master BOM creation module 110 may add the corresponding alternate value from second BOM source in the variant column in master BOM table (i.e., add variant value that corresponds to the BOM line from the second BOM Source). For example, referring to FIG. 5, the processing at block 225 is illustrated for the 12xxxx_X, 12xxxx_Q, and 12xxx_Y components.

Further, at block 213, the associated BOM line for the second source may be marked as processed. For example, referring to FIG. 5, the processing at block 225 is illustrated by the updated MBOM table for corresponding rows.

The master BOM creation process 200 discussed with reference to FIGS. 6, 7A, and 7B may be repeated for other BOM sources (e.g., SBOM 106, etc.), and merged with the master BOM table created as discussed above.

Figure 8:
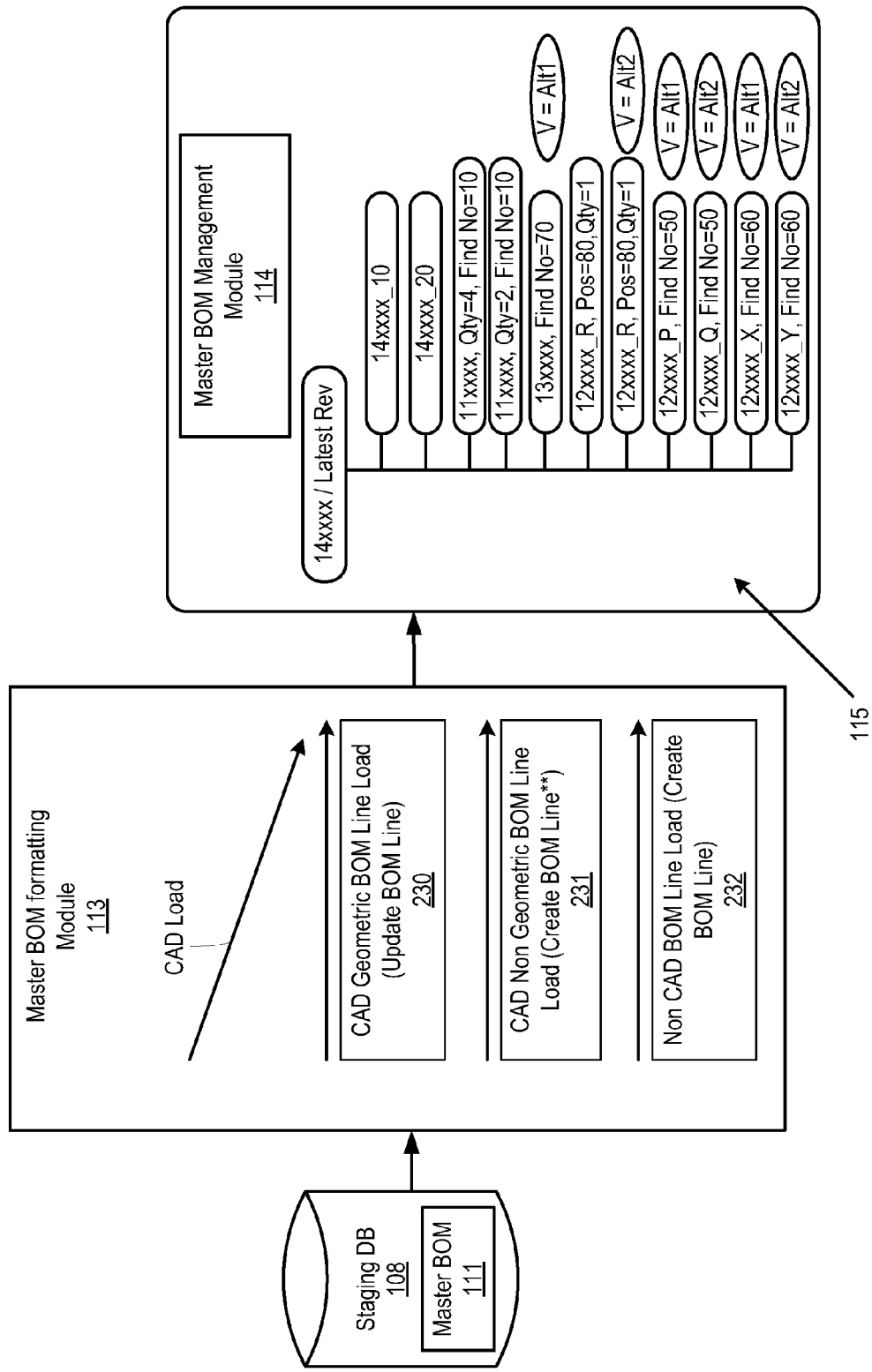
FIG. 8 illustrates a BOM upload process, according to an example of the present disclosure.

Referring to FIGS. 1 and 8, the master BOM formatting module 113 may format the master BOM 111 based, for example, on one or more of the source BOM configurations. A master BOM including geometric CAD details may be distinguished in the master BOM creation system 100 by loading the geometric CAD details in a specific sequence and with different configurations in the master BOM creation system 100, so as to avoid any impact on original CAD BOM data related to CAD geometry and assembly. The formatted master BOM 111 may be uploaded to the master BOM management module 114 which may provide for management of one or more master BOMs 115 including the master BOM 111. The master BOM formatting module 113 may determine whether a BOM line originates from a CAD model or a non CAD model (e.g., BOM line originates from the ERP system 105, the service system 107, or another system). For example, the CAD BOM line may include geometric information or no geometric information (e.g., the BOM line component is oil or grease in a bearing assembly). Based on the determination of whether a BOM line originates from a CAD model or a non CAD model, the master BOM formatting module 113 may upload a CAD BOM line so as to avoid any impact on the geometric aspects of the BOM. Thus, based on the determination made by the master BOM formatting module 113, the upload of the master BOM 111 to the master BOM management module 114 may differ as follows.

Referring to FIG. 8, first, for a CAD BOM line with geometry (i.e., CAD geometric BOM), at 230, the BOM line may be updated by the master BOM formatting module 113 since geometric information is already present in the BOM line. Block 230 may map to location 236 of FIG. 9 (described below). The CAD BOM may be already loaded through a third party tool, hence the corresponding BOM line is available, and changes may be required in some BOM line properties (e.g., find number in the case of FIG. 5, see 14xxx_10, 14xxx_20, 12xxx_P, and 11xxx with quantity of four).

Secondly, at 231, for a CAD BOM line without geometry (i.e., CAD non geometric BOM line), the BOM line may be created by the master BOM formatting module 113. If the CAD BOM line without geometry is loaded to the master BOM management module 114, and the master BOM management module 114 does not create the CAD BOM line without geometry, then the CAD BOM line without geometry may be loaded to the master BOM management module 114 with a create option, and otherwise with an update option. Block 231 may map to location 237 of FIG. 9 (described below). Block 231 may relate, for example, to the 13xxxx component from the CAD BOM 102 of FIG. 5.

Third, at 232, for a non CAD BOM line (e.g., BOM lines from other systems which are not merged with CAD BOM lines and are required to be created as a new BOM line in the master BOM; see FIG. 5, 12xxx_X, 12xxx_Y, 12xxx_Q, and 11xxx with quantity of two components). BOM lines from the ERP system 105, the service system 107, or another system), the BOM line may be created by the master BOM formatting module 113. Block 232 may map to location 238 of FIG. 9 (described below).

Thus, the master BOM formatting module 113 may differentiate between CAD model and non CAD model BOM lines, and for the CAD model BOM lines, the master BOM formatting module 113 may differentiate between geometric and non-geometric BOM lines.

Figure 9:
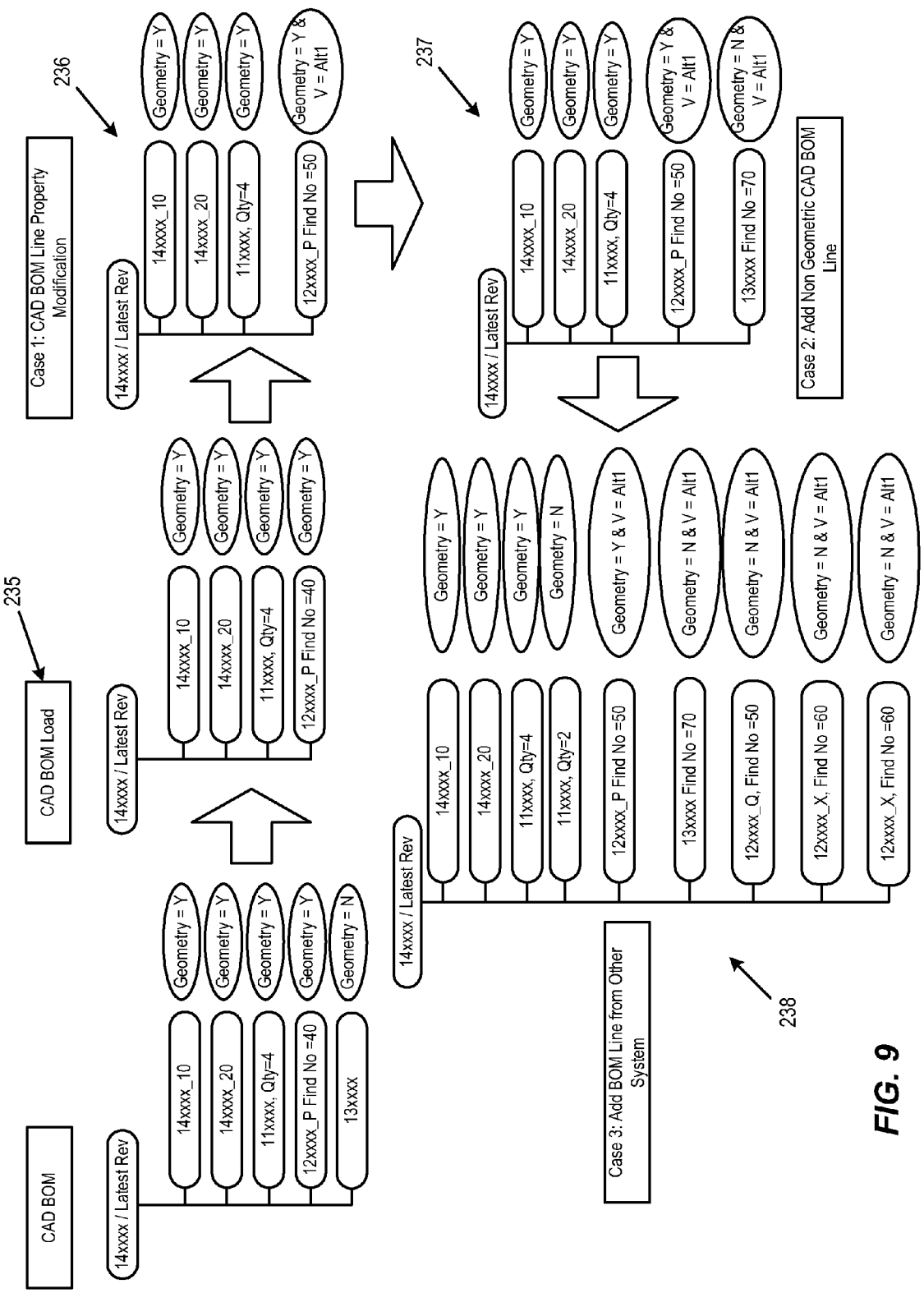
FIG. 9 illustrates three use cases, according to an example of the present disclosure.

Referring to FIGS. 1 and 9, FIG. 9 illustrates three use cases, according to an example of the present disclosure. Case 1 illustrates CAD BOM line property modification, case 2 illustrates adding a non-geometric CAD BOM line, and case 3 illustrates adding a BOM line from another system. At 235, the CAD BOM may be loaded through a third party utility. At 236, the property of the existing BOM line property (find no) may be modified, and a variant may be created. At 237, a new BOM line with no geometry that exists in the original BOM may be recreated with required properties. At 238, a non CAD BOM line from the other system may be created in the master BOM.

Figure 10:
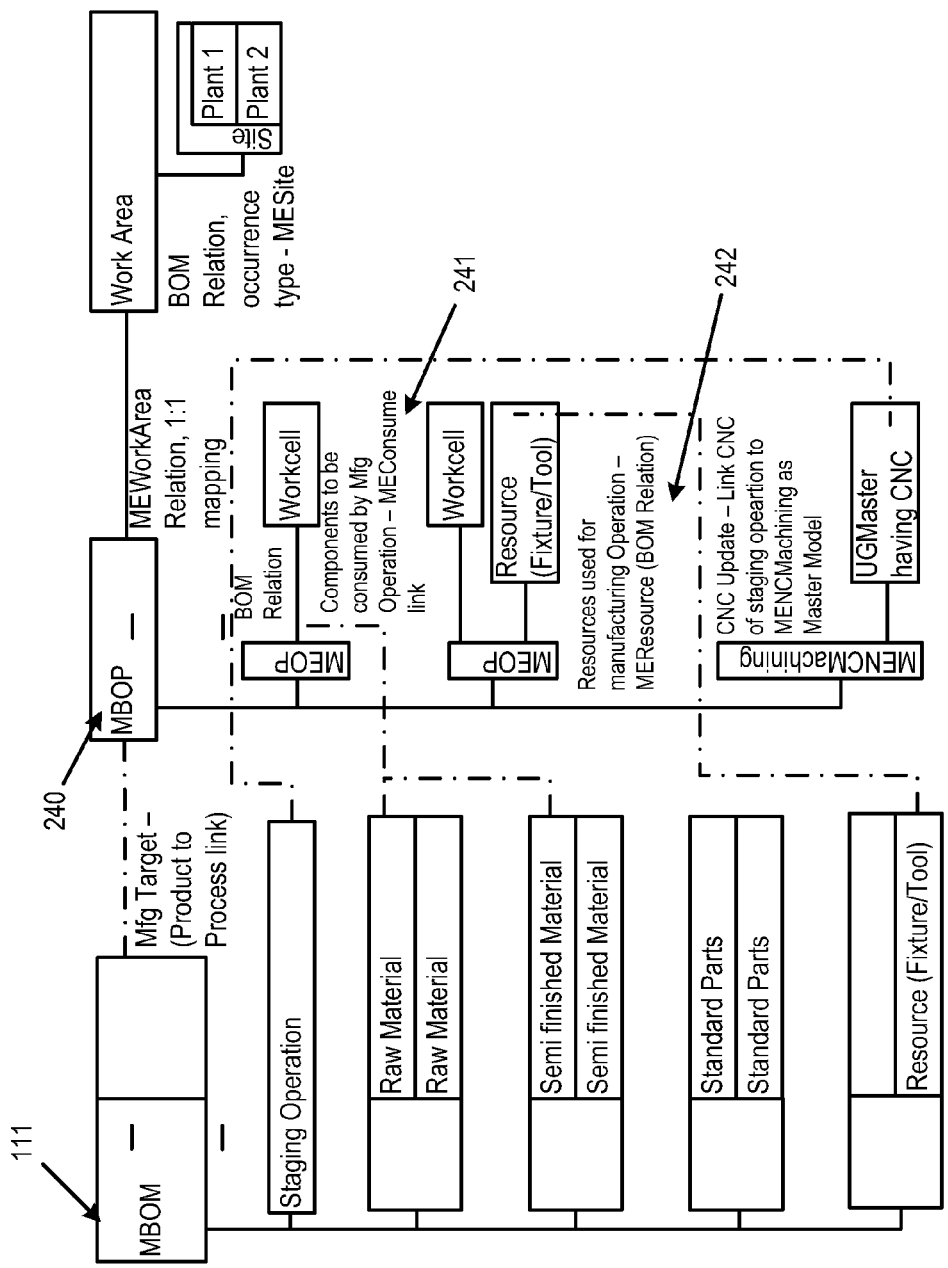
FIG. 10 illustrates an example of a MBOM and router data model, according to an example of the present disclosure.

Referring to FIGS. 1 and 10, FIG. 10 illustrates an example of a MBOM and router data model, according to an example of the present disclosure. The master BOM 111 created by the master BOM creation module 110 may be linked to a router or BOP operation 240. In order to link the master BOM 111 to the BOP operation 240, a MEConsume link 241 and a MEResource link 242 may provide a link to the BOP operation 240 as component allocation.

Figure 11:
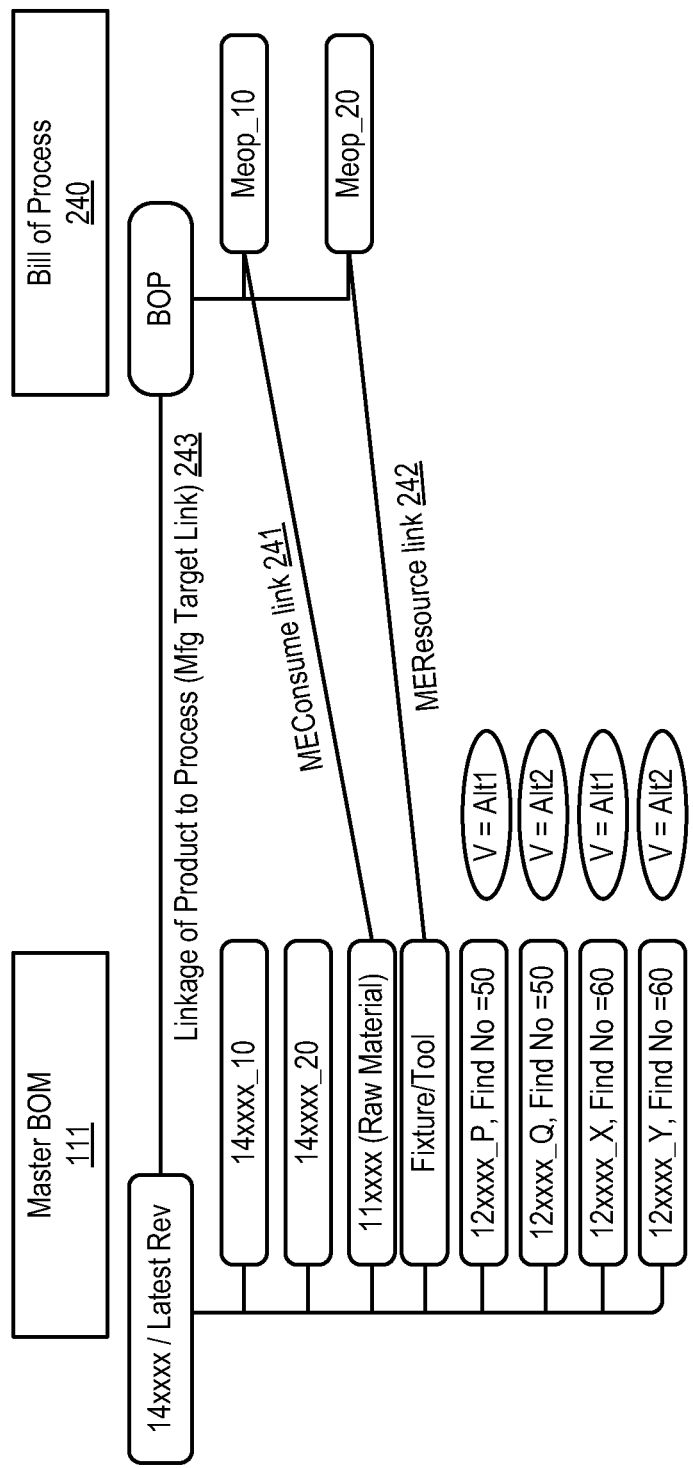
FIG. 11 illustrates master BOM linking to a bill of process (BOP) operation, according to an example of the present disclosure.

Referring to FIGS. 1 and 11, FIG. 11 illustrates master BOM linking to a bill of process (BOP) operation, according to an example of the present disclosure. The master BOM 111 created by the master BOM creation module 110 may be linked to a router or BOP operation 240. In order to link the master BOM 111 to the BOP operation 240, a link 243 (e.g., a manufacturing target link) may provide a product link for the master BOM 111 to the BOP operation 240. Further at 241 and 242, the master BOM resources may be linked to the BOP operation 240 as component allocation. As shown in FIG. 11, the MEConsume link 241 may link the raw material of the master BOM 111 to the BOP operation 240 as component allocation. Further, the MEResource link 242 may link the fixtures and tools of the master BOM 111 to the BOP operation 240 as component allocation. Moreover, the affect of any change to an original BOM (e.g., a MBOM) that included the initial MEConsume link 241 and MEResource link 242 and that is used to generate the master BOM 111 may be readily visible in the master BOM 111. In order to link the master BOM 111 to the BOP operation 240, generally, a staging table may be used to upload linking information from the master BOM 111 to the BOP operation 240. A linking table may be created to update information from an input linking table by comparing the input linking table to information from the master BOM 111. The linking table may be loaded into the master BOM management module 114, and along with the router information (i.e., BOP operation 240 information), the linking table may be used to link the master BOM 111 to the BOP operation 240.

Figure 12:
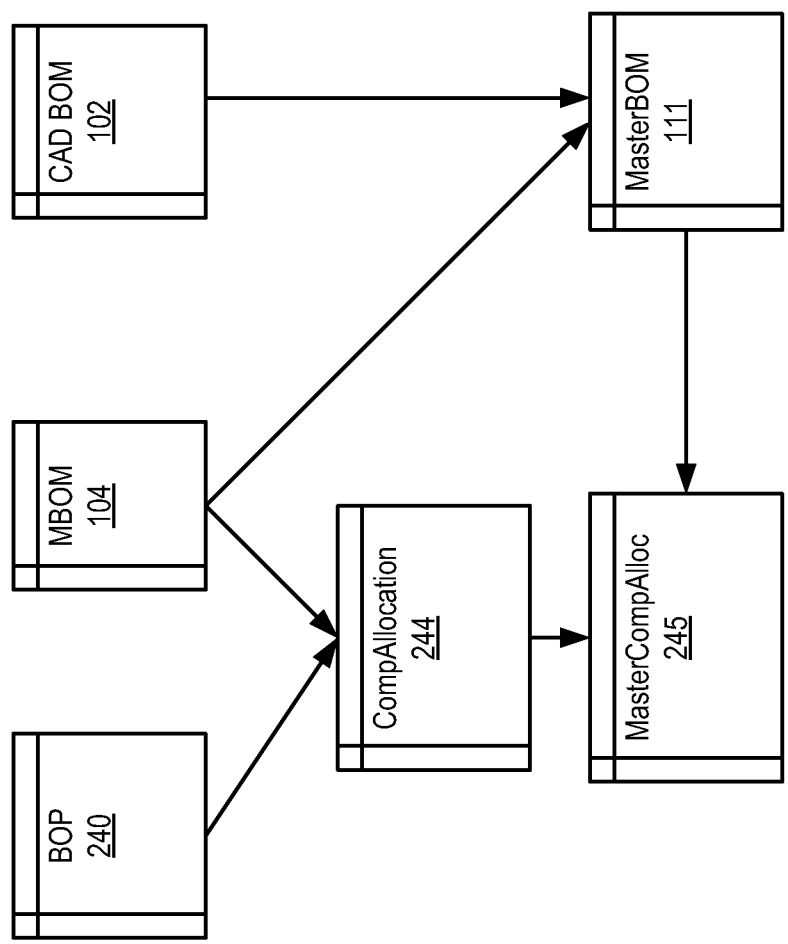
FIG. 12 illustrates a database design for component allocation linking, according to an example of the present disclosure.

Referring to FIGS. 1 and 12, FIG. 12 illustrates a database design for component allocation linking, according to an example of the present disclosure. Referring to FIG. 12, linking between the master BOM 111 and the router (i.e., BOP operation 240) may be created by traversing component allocation information obtained from an ERP system. In order to create a component allocation link between the master BOM 111 and the BOP operation 240, the MBOM 104, BOP operation 240, and component allocation 244 from the ERP system 105 may be loaded in a corresponding table in the staging DB 108. The CAD BOM 102 may be also located in the staging DB 108. The master BOM 111 may be created as discussed above by the master BOM creation module 110 by merging the CAD BOM 102 and MBOM 104. A master component allocation table 245 may be created by processing data from component allocation 244, and the master BOM 111. The master BOM 111 and the master component allocation table 245 may be loaded to the master BOM management module 114 for management of the master BOM 111 and the BOP operation 240.

Figure 13:
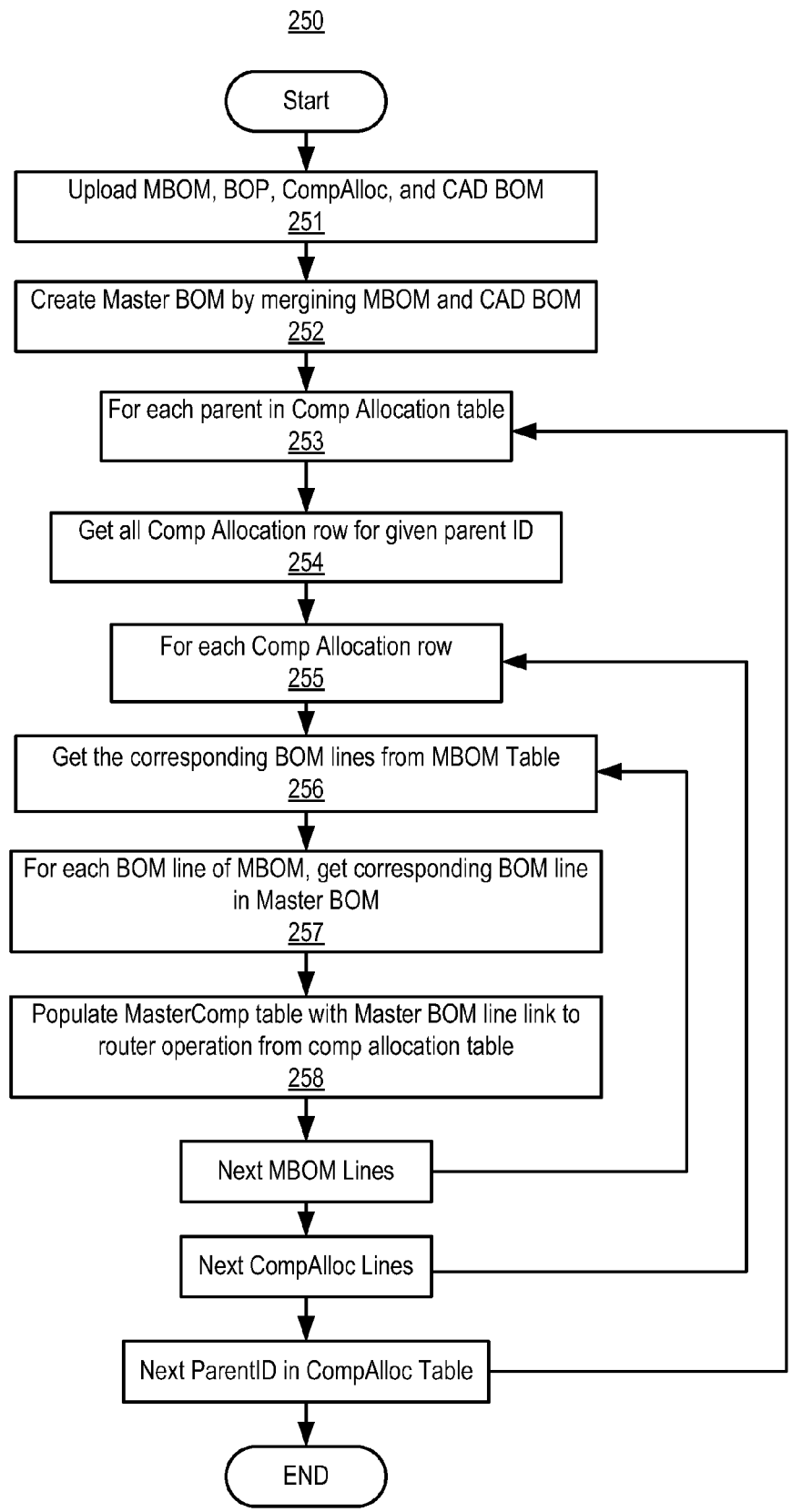
FIG. 13 illustrates a process for master component allocation, according to an example of the present disclosure.

Referring to FIG. 13, a process 250 for master component allocation described above with reference to FIG. 12 is described in further detail, according to an example of the present disclosure. The process 250 for master component allocation may begin at block 251 by uploading the MBOM 104, BOP operation 240, component allocation 244 from the ERP system 105, and CAD BOM 102. At block 252, the master BOM 111 may be created by the master BOM creation module 110 by merging the MBOM 104 and the CAD BOM 102. At block 253, for each parent ID in the component allocation table, at block 254, all component allocation rows for a given parent ID may be obtained. At block 255, for each component allocation row, at block 256, the corresponding BOM lines may be obtained from the MBOM table. At block 257, for each BOM line of the MBOM 104, a corresponding BOM line in the master BOM 111 may be obtained. At block 258, the master component allocation table may be populated with the master BOM line link to router operation from the component allocation table.

Figure 14:
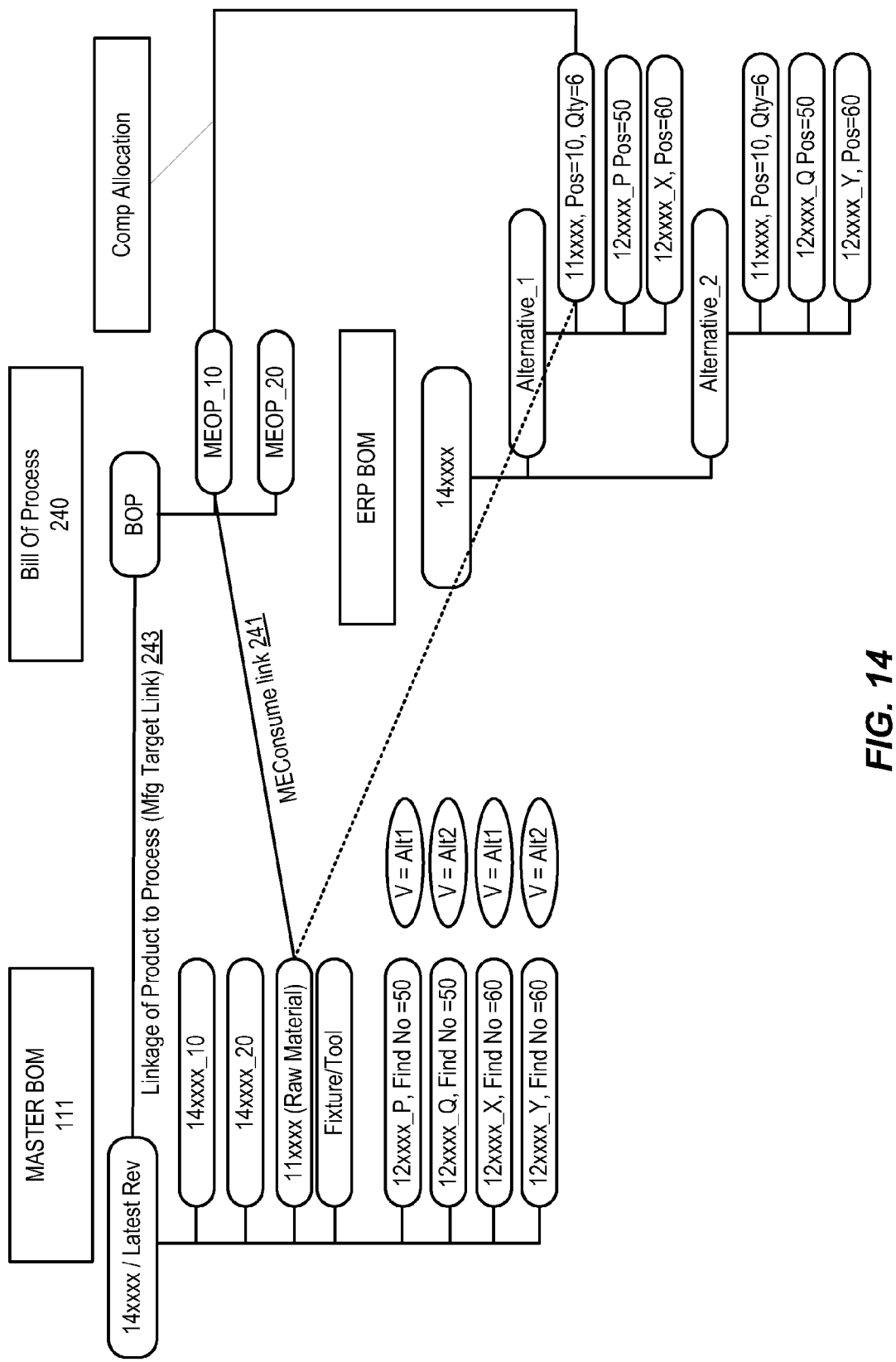
FIG. 14 illustrates master BOM linking to a BOP operation, according to an example of the present disclosure.

Referring to FIGS. 1 and 14, FIG. 14 illustrates master BOM linking to a BOP operation, according to an example of the present disclosure. The master BOM 111 created by the master BOM creation module 110 may be linked to a router or the BOP operation 240. In order to link the master BOM 111 to the BOP operation 240, the link 243 (e.g., a manufacturing target link) may provide a product link for the master BOM 111 to the BOP operation 240. Further, at 241, the master BOM resources may be linked to the BOP operation 240 as component allocation. In order to link the master BOM 111 to the BOP operation 240, generally, a staging table may be used to upload linking information from the master BOM 111 to the BOP operation 240. A linking table may be created to update information from an input linking table by comparing the input linking table to information from the master BOM 111. The linking table may be loaded into the master BOM management module 114, and along with the router information (i.e., BOP operation 240 information), the linking table may be used to link the master BOM 111 to the BOP operation 240.

Figure 15:
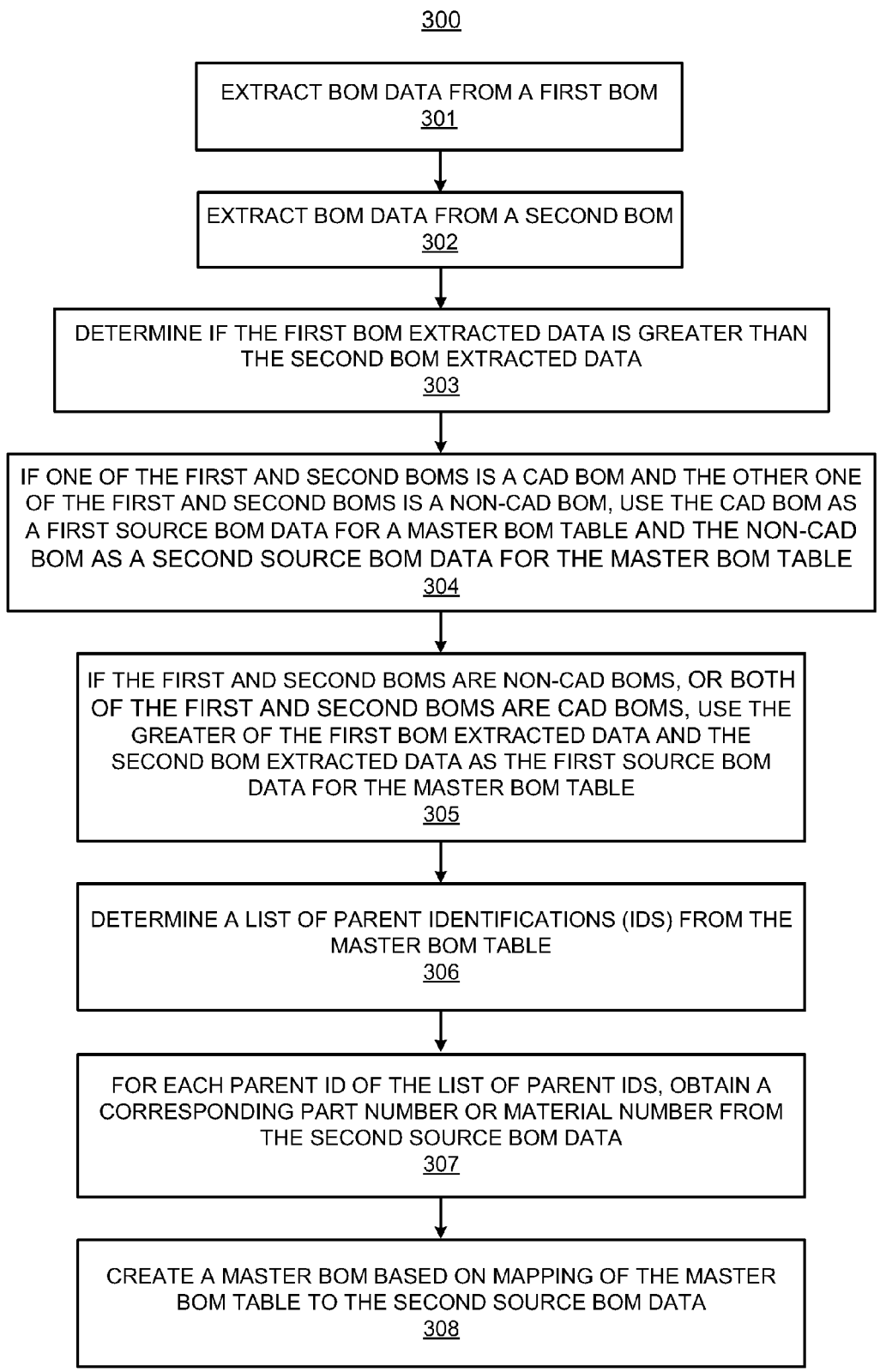
FIG. 15 illustrates a method for master BOM creation, according to an example of the present disclosure.

FIG. 15 illustrates a flowchart of a method 300 for master BOM creation. The method 300 may be implemented on the master BOM creation system 100 described above with reference to FIGS. 1-14 by way of example and not limitation. The method 300 may be practiced in other systems.

Referring to FIG. 15, at block 301, the method 300 may include extracting BOM data from a first BOM. For example, referring to FIG. 1, the BOM data extraction module 101 may extract BOM data from different sources, such as, for example, CAD BOM 102 from the PLM system 103, MBOM 104 from the ERP system 105, SBOM 106 from the service system 107, etc. Further, referring to FIGS. 6, 7A, and 7B, at block 201, the master BOM creation module 110 may load BOM data from a table corresponding to a first source (i.e., including first BOM data) to the master BOM table.

At block 302, BOM data from a second BOM may be extracted. For example, referring to FIG. 1, the BOM data extraction module 101 may extract BOM data from another source, such as, for example, CAD BOM 102 from the PLM system 103, MBOM 104 from the ERP system 105, SBOM 106 from the service system 107, etc.

At block 303, a determination is made if the first BOM extracted data is greater (i.e., more data lines) than the second BOM extracted data.

At block 304, if one of the first and second BOMs is a CAD BOM and the other one of the first and second BOMs is a non-CAD BOM, the CAD BOM may be used as a first source BOM data for a master BOM table and the non-CAD BOM as a second source BOM data for the master BOM table. For example, referring to FIGS. 6, 7A, and 7B, for the case of CAD BOM or non-CAD BOMs, the first BOM data may be data from the CAD BOM.

At block 305, if the first and second BOMs are non-CAD BOMs, or both of the first and second BOMs are CAD BOMs, the greater of the first BOM extracted data and the second BOM extracted data may be used as the first source BOM data for the master BOM table, and the lesser of the first BOM extracted data and the second BOM extracted data may be designated as the second source BOM data. For example, referring to FIG. 1, the extracted BOM data may be uploaded to a staging DB 108 by a staging DB upload module 109. Referring to FIGS. 6, 7A, and 7B, in the case of non-CAD BOMs, the first BOM data may be determined as the greater (i.e., more data lines) of the non-CAD BOMs.

At block 306, a list of parent IDs may be determined from the master BOM table. For example, referring to FIG. 1, the master BOM creation module 110 may use the uploaded BOM data to create a master BOM 111. Further, referring to FIGS. 6, 7A, and 7B, the master BOM creation module 110 may determine a list of parent IDs from the master BOM table.

At block 307, for each parent ID of the list of parent IDs, a corresponding part number or material number may be obtained from the second source BOM data. For example, referring to FIGS. 6, 7A, and 7B, for each parent ID in the master BOM table, at block 204, the master BOM creation module 110 may obtain corresponding part number or material number information from a second source (i.e., including second BOM data).

At block 308, a master BOM may be created based on mapping of the master BOM table to the second source BOM data. For example, referring to FIG. 1, the master BOM creation module 110 may map the master BOM table to the second source BOM data to create the master BOM 111. For example, the master BOM creation module 110 may obtain rows from the second source BOM data where a parent ID of the list of parent IDs is equal to the corresponding part number or material number, for each obtained row from the second source BOM data, for a child component ID, determine if an associated find number is present in the master BOM table from a CAD BOM line with no update from a MBOM, and if an associated find number is present for the child component ID in the master BOM table, update the find number of an appropriate master BOM table line with the second source BOM data. Further, the master BOM creation module 110 may obtain rows from the second source BOM data where the parent ID of the list of parent IDs is equal to the corresponding part number or material number, for each obtained row from the second source BOM data, for a child component ID, determine if an associated find number is present in the master BOM table, and determine if the associated find number is the same as or different than the master BOM table. If the find number is determined to be the same find number compared to the master BOM table, the master BOM creation module 110 may determine an associated master BOM table quantity value in the master BOM table by summing quantity value of all given components in the master BOM table having the same find number and component ID. If the master BOM table quantity value is the same as the quantity in a BOM line from the second source BOM data, the master BOM creation module 110 may add an associated BOM alternate value in a variant column of the master BOM table for all matching BOM lines in the master BOM table. If the master BOM table quantity value is less than the quantity in a BOM line from the second source BOM data, the master BOM creation module 110 may update all corresponding master BOM table rows with given alternate value from the second source BOM data, add BOM line data in the master BOM table with a find number the same as from a BOM line in the second source BOM data and quantity equal to the difference between the quantity value in the second source BOM data and the master BOM table, and add a corresponding alternate value from the second source BOM data in a variant column in the master BOM table in the added BOM line data and in a BOM line where the find number matches a given BOM line. If the master BOM table quantity is greater than the quantity in a BOM line from the second source BOM data, the master BOM creation module 110 may obtain all BOM lines whose quantity sum matches the quantity in the second source BOM data, add corresponding alternate value from the second source BOM data in a variant column of the master BOM table in the BOM line, and add corresponding alternate value from the second source BOM data in the variant column in all rows of the master BOM table. If the find number is determined to be a different find number compared to the master BOM table, the master BOM creation module 110 may add BOM line data in the master BOM table with the find number and quantity same as from a BOM line in the second source BOM data, and add a corresponding alternate value from the second source BOM data in a variant column in the master BOM table. The master BOM creation module 110 may determine if a BOM line for the master BOM originates from a CAD BOM or a non-CAD BOM, and if the BOM line originates from a CAD BOM, for a CAD BOM line with geometry, format the master BOM by updating the CAD BOM line in the master BOM. If the BOM line originates from a CAD BOM, for a CAD BOM line without geometry, the master BOM creation module 110 may format the master BOM by updating the BOM line with no geometry value. If the BOM line originates from a non-CAD BOM, for a non-CAD BOM line, the master BOM creation module 110 may format the master BOM by updating the non-CAD BOM line in the master BOM. The master BOM creation module 110 may extract the BOM data from the first BOM from a PLM system, an ERP system, or a service system, and extract the BOM data from the second BOM from another one of the PLM system, the ERP system, and the service system. The master BOM creation module 110 may format the master BOM based on a format of the first source BOM data. The master BOM creation module 110 may apply a rule to overwrite a find number for a CAD BOM by a find number from the MBOM. The master BOM creation module 110 may use lines from the MBOM that have different material ID but identical position for different alternatives in the master BOM as variant components, and use lines from the MBOM that have identical material ID and identical position for different alternatives in the master BOM as non-variant components.

The master BOM creation module 110 may determine parent IDs of the list of parent IDs that include alternate values, and for the determined parent IDs of the list of parent IDs that include alternate values, map the alternate values to the second source BOM data.

Figure 16:
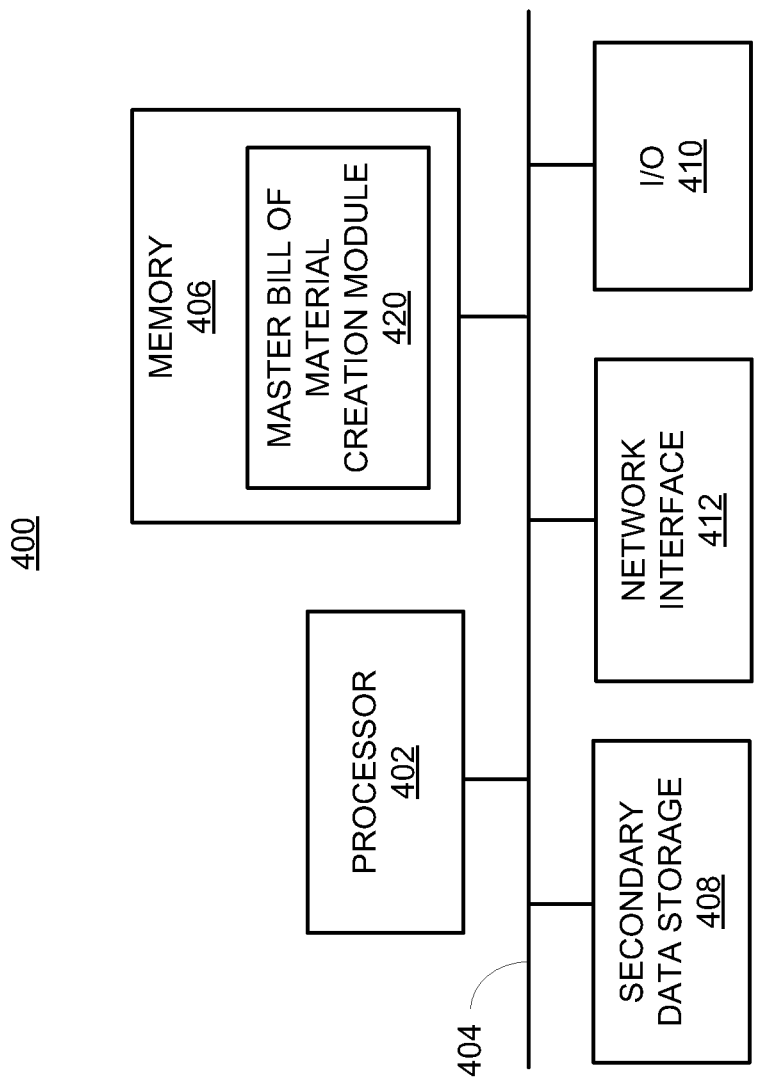
FIG. 16 illustrates a computer system, according to an example of the present disclosure.

FIG. 16 shows a computer system 400 that may be used with the examples described herein. The computer system 400 represents a generic platform that includes components that may be in a server or another computer system. The computer system 400 may be used as a platform for the system 100. The computer system 400 may execute, by a processor or other hardware processing circuit, the methods, functions and other processes described herein. These methods, functions and other processes may be embodied as machine readable instructions stored on computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 400 includes a processor 402 that may implement or execute machine readable instructions performing some or all of the methods, functions and other processes described herein. Commands and data from the processor 402 are communicated over a communication bus 404. The computer system 400 also includes a main memory 406, such as a random access memory (RAM), where the machine readable instructions and data for the processor 402 may reside during runtime, and a secondary data storage 408, which may be non-volatile and stores machine readable instructions and data. The memory and data storage are examples of computer readable mediums. The memory 406 may include a master BOM creation module 420 including machine readable instructions residing in the memory 406 during runtime and executed by the processor 402. The module 420 may include the modules of the system 100 shown in FIGS. 1-14.

The computer system 400 may include an I/O device 410, such as a keyboard, a mouse, a display, etc. The computer system 400 may include a network interface 412 for connecting to a network. Other known electronic components may be added or substituted in the computer system 400.

What has been described and illustrated herein are examples along with some of their variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

What is claimed is:

1. A master bill of materials (BOM) creation system comprising:
  a memory storing machine readable instructions to:
    extract BOM data from a first BOM;
    extract BOM data from a second BOM;
    generate, based on a determination of whether at least one of the first and second BOMs is a computer aided design (CAD) BOM or a non-CAD BOM, a master BOM table based on the first and second BOMs;
    determine a list of parent identifications (IDs) from the master BOM table;
    for each parent ID of the list of parent IDs, obtain a corresponding part number or material number from one of the first and second BOMs; and create a master BOM based on mapping of the master BOM table to the one of the first and second BOMs; and a processor to implement the machine readable instructions.

2. The master BOM creation system of claim 1, wherein to create the master BOM based on mapping of the master BOM table to the one of the first and second BOMs, the machine readable instructions are further to:

obtain rows from the one of the first and second BOMs where a parent ID of the list of parent IDs is equal to the corresponding part number or material number;

for each obtained row from the one of the first and second BOMs, for a child component ID, determine if an associated find number is present in the master BOM table from a CAD BOM line with no update from a material BOM (MBOM); and if an associated find number is present for the child component ID in the master BOM table, update the find number of an appropriate master BOM table line with the one of the first and second BOMs.

3. The master BOM creation system of claim 1, wherein to create the master BOM based on mapping of the master BOM table to the one of the first and second BOMs, the machine readable instructions are further to:

obtain rows from the one of the first and second BOMs where a parent ID of the list of parent IDs is equal to the corresponding part number or material number;

for each obtained row from the one of the first and second BOMs, for a child component ID, determine if an associated find number is present in the master BOM table; and determine if the associated find number is the same as or different than the master BOM table.

4. The master BOM creation system of claim 3, wherein if the find number is determined to be the same find number compared to the master BOM table, the machine readable instructions are further to:

determine an associated master BOM table quantity value in the master BOM table by summing all given components in the master BOM table having the same find number and component ID.

5. The master BOM creation system of claim 4, wherein if the master BOM table quantity value is the same as a quantity in a BOM line from the one of the first and second BOMs, the machine readable instructions are further to:

add an associated BOM alternate value in a variant column of the master BOM table for all matching BOM lines in the master BOM table.

6. The master BOM creation system of claim 4, wherein if the master BOM table quantity value is less than a quantity in a BOM line from the one of the first and second BOMs, the machine readable instructions are further to:

update all corresponding master BOM table rows with given alternate value from the one of the first and second BOMs;

add BOM line data in the master BOM table with a find number the same as from a BOM line in the one of the first and second BOMs and quantity equal to the difference between the quantity value in the one of the first and second BOMs and the master BOM table; and add a corresponding alternate value from the one of the first and second BOMs in a variant column in the master BOM table in the added BOM line data and in a BOM line where the find number matches a given BOM line.

7. The master BOM creation system of claim 4, wherein if the master BOM table quantity is greater than a quantity in a BOM line from the one of the first and second BOMs, the machine readable instructions are further to:

obtain all BOM lines whose quantity sum matches the quantity in the one of the first and second BOMs;

add corresponding alternate value from the one of the first and second BOMs in a variant column of the master BOM table in the BOM line; and add corresponding alternate value from the one of the first and second BOMs in the variant column in all corresponding rows of the master BOM table.

8. The master BOM creation system of claim 3, wherein if the find number is determined to be a different find number compared to the master BOM table, the machine readable instructions are further to:

add BOM line data in the master BOM table with the find number and quantity same as from a BOM line in the one of the first and second BOMs; and add a corresponding alternate value from the one of the first and second BOMs in a variant column in the master BOM table.

9. The master BOM creation system of claim 1, further comprising machine readable instructions to:

determine if a BOM line for the master BOM originates from the CAD BOM or the non-CAD BOM; and if the BOM line originates from the CAD BOM, for a CAD BOM line with geometry, format the master BOM by updating the CAD BOM line in the master BOM.

10. The master BOM creation system of claim 1, further comprising machine readable instructions to:

determine if a BOM line for the master BOM originates from the CAD BOM or the non-CAD BOM; and if the BOM line originates from the CAD BOM, for a CAD BOM line without geometry, format the master BOM by creating the CAD BOM line in the master BOM.

11. The master BOM creation system of claim 1, further comprising machine readable instructions to:

determine if a BOM line for the master BOM originates from the CAD BOM or the non-CAD BOM; and if the BOM line originates from the non-CAD BOM, for a non-CAD BOM line, format the master BOM by creating the non-CAD BOM line in the master BOM.

12. The master BOM creation system of claim 1, wherein to extract the BOM data from the first BOM, and to extract the BOM data from the second BOM, the machine readable instructions are further to:

extract the BOM data from the first BOM from one of a product lifecycle management (PLM) system, an enterprise resource planning (ERP) system, and a service system; and extract the BOM data from the second BOM from another one of the product lifecycle management (PLM) system, the enterprise resource planning (ERP) system, and the service system.

13. The master BOM creation system of claim 1, wherein to create the master BOM based on mapping of the master BOM table to the one of the first and second BOMs, the machine readable instructions are further to:

format the master BOM based on a format of the other one of the first and second BOMs.

14. The master BOM creation system of claim 1, wherein the first BOM is the CAD BOM, and the second BOM is one of a material BOM (MBOM) and a service BOM (SBOM).

15. The master BOM creation system of claim 1, wherein to create the master BOM based on mapping of the master BOM table to the one of the first and second BOMs, the machine readable instructions are further to:

apply a rule to overwrite a find number for the CAD BOM by a find number from a material BOM (MBOM).

16. The master BOM creation system of claim 1, wherein to create the master BOM based on mapping of the master BOM table to the one of the first and second BOMs, the machine readable instructions are further to:

use lines from a material BOM (MBOM) that have different material ID but identical position for different alternatives in the master BOM as variant components; and use lines from the MBOM that have identical material ID and identical position for different alternatives in the master BOM as non-variant components.

17. The master BOM creation system of claim 1, wherein to create the master BOM based on mapping of the master BOM table to the one of the first and second BOMs, the machine readable instructions are further to:

determine parent IDs of the list of parent IDs that include alternate values; and for the determined parent IDs of the list of parent IDs that include alternate values, map the alternate values to the one of the first and second BOMs.

18. The master BOM creation system of claim 1, further comprising machine readable instructions to:

link the master BOM to at least one of a bill of process (BOP) operation and a component allocation table.

19. A method for master bill of materials (BOM) creation, the method comprising:

extracting BOM data from a first BOM;
extracting BOM data from a second BOM;
generating, based on a determination of whether at least one of the first and second BOMs is a computer aided design (CAD) BOM or a non-CAD BOM, a master BOM table based on the first and second BOMs
determining a list of parent identifications (IDs) from the master BOM table;
for each parent ID of the list of parent IDs, obtaining a corresponding part number or material number from one of the first and second BOMs;
creating, by a processor, a master BOM based on mapping of the master BOM table to the one of the first and second BOMs; and
formatting the master BOM based on a format of the other one of the first and second BOMs.

20. A non-transitory computer readable medium having stored thereon machine readable instructions for master bill of materials (BOM) creation, the machine readable instructions when executed cause a computer system to:

extract BOM data from a first BOM;
extract BOM data from a second BOM;
generate, based on a determination of whether at least one of the first and second BOMs is a computer aided design (CAD) BOM or a non-CAD BOM, a master BOM table based on the first and second BOMs;
determine a list of parent identifications (IDs) from the master BOM table;
for each parent ID of the list of parent IDs, obtain a corresponding part number or material number from one of the first and second BOMs;
create, by a processor, a master BOM based on mapping of the master BOM table to the one of the first and second BOMs; and
link the master BOM to at least one of a bill of process (BOP) operation and a component allocation table.

* * * * *